US012658668B2

(12) United States Patent
Mitchell et al.

(10) Patent No.: US 12,658,668 B2
(45) Date of Patent: Jun. 16, 2026

(54) ON-CHIP INTEGRATION OF OPTICAL COMPONENTS WITH PHOTONIC WIRE BONDS AND/OR LENSES

(71) Applicant: The University of British Columbia, Vancouver (CA)

(72) Inventors: Matthew John Mitchell, Burnaby (CA); Lukas Chrostowski, Vancouver (CA); Becky Lin, Vancouver (CA); Kashif Masud Awan, St. Louis, MO (US); Shangxuan Yu, Vancouver (CA); Donald Witt, Vancouver (CA); Seyediman Taghavi, Vancouver (CA)

(73) Assignee: The University of British Columbia, Vancouver (CA)

( * ) Notice: Subject to any disclaimer, the term of this patent is extended or adjusted under 35 U.S.C. 154(b) by 684 days.

(21) Appl. No.: 17/969,709

(22) Filed: Oct. 20, 2022

(65) Prior Publication Data

US 2023/0148361 A1     May 11, 2023

Related U.S. Application Data

(60) Provisional application No. 63/257,758, filed on Oct. 20, 2021.

(51) Int. Cl.
*H01S 5/02355* (2021.01)
*H01S 5/02345* (2021.01)
(Continued)

(52) U.S. Cl.
CPC ........ *H01S 5/02355* (2021.01); *H01S 5/0235* (2021.01); *H10H 20/036* (2025.01);
(Continued)

(58) Field of Classification Search
CPC .............. H01S 5/0235; H01S 5/02355; H01S 5/02326; H01S 5/02345; G02B 6/4201;
(Continued)

(56) References Cited

U.S. PATENT DOCUMENTS 9,034,222 B2     5/2015  Koos et al.
10,345,524 B2    7/2019  Jiang et al.
(Continued)

FOREIGN PATENT DOCUMENTS

WO          2011046898 A1      4/2011
WO     WO-2011136404 A1 *  11/2011  ........... H10H 20/858
WO     WO-2023014647 A1 *   2/2023  ......... H01S 5/02326

OTHER PUBLICATIONS

M. Blaicher, et al., "Hybrid multi-chip assembly of optical communication engines by in situ 3D nano-lithography", Light Sci Appl 9, 71 (2020).
(Continued)

*Primary Examiner* — David A Zarneke
(74) *Attorney, Agent, or Firm* — Todd A. Rattray; Oyen Wiggs Green & Mutala LLP

(57) ABSTRACT

Systems and methods for fabricating a semiconductor chip with an integrated laser diode (or other optical component). An example method may comprise fabricating a recess shaped to receive the optical component. The method may also comprise metallizing at least one surface of the recess. The method may also comprise coupling the optical component to the at least one metallized surface of the recess. The component may comprise a laser diode comprising a p-type semiconductor and an n-type semiconductor. The n-type semiconductor may be electrically coupled to the at least one metallized surface of the recess. The method may also comprise optically coupling an optical output of the laser diode (or other optical component) to an optical input
(Continued)

of a photonic interface of the chip with a photonic wire bond and/or at least one polymer lens.

20 Claims, 14 Drawing Sheets

(51) Int. Cl.
| | |
|---|---|
| *H01S 5/0235* | (2021.01) |
| *H10H 20/01* | (2025.01) |
| *H10H 20/85* | (2025.01) |

(52) U.S. Cl.
CPC ........ *H10H 20/85* (2025.01); *H10H 20/8502* (2025.01); *H10H 20/8504* (2025.01); *H10H 20/8506* (2025.01); *H10H 20/8508* (2025.01); *H01S 5/02345* (2021.01)

(58) Field of Classification Search
CPC .... G02B 6/4274; H10H 20/036; H10H 20/85; H10H 20/8502; H10H 20/8504; H10H 20/8506; H10H 20/8508
See application file for complete search history.

(56) References Cited

U.S. PATENT DOCUMENTS

| | | | |
|---|---|---|---|
| 11,789,202 B2 * | 10/2023 | Ji ......................... | G02B 6/4245 |
| | | | 385/14 |
| 2007/0170417 A1 | 7/2007 | Bowers | |
| 2014/0254991 A1 * | 9/2014 | Strzalkowski .......... | G02B 6/43 |
| | | | 385/89 |
| 2019/0258175 A1 | 8/2019 | Dietrich et al. | |
| 2021/0364694 A1 | 11/2021 | Hickey et al. | |
| 2022/0187550 A1 * | 6/2022 | Baudot ............. | G02B 6/12004 |

OTHER PUBLICATIONS

A silicon photonic evanescent-field sensor architecture using a fixed-wavelength laser, L. Chrostowski et al., SPIE Opto 2021, doi: 10.1117/12.2579095.

SiEPICfab: the Canadian silicon photonics rapid-prototyping foundry for integrated optics and quantum computing, A. Darcie et. al., SPIE Opto 2021, doi: 10.1117/12.2583432.

* cited by examiner

10

17  16  19  18

12

14

15  11  12A  13

ON-CHIP INTEGRATION OF OPTICAL COMPONENTS WITH PHOTONIC WIRE BONDS AND/OR LENSES

CROSS-REFERENCE TO RELATED APPLICATIONS

This application claims the benefit under 35 U.S.C. § 119 of U.S. application No. 63/257,758 filed 20 Oct. 2021 and entitled PHOTONIC WIRE BONDING FOR SILICON PHOTONICS III-V LASER INTEGRATION which is hereby incorporated herein by reference for all purposes.

FIELD

The present disclosure relates to semiconductor chip fabrication systems and methods. Some embodiments provide fabrication methods for integrating optical components onto a chip with a photonic wire bond.

BACKGROUND

Optical components such as laser diodes are typically integrated into semiconductor chips by coupling the laser diode p-side down on the chip. In such cases an optical waveguide of the laser diode is facing downwards and must be precisely aligned with a photonic waveguide of the chip. Such precision alignment requires height control (e.g. achievable by epitaxial control) as well as horizontal and rotational alignment which may be accomplished using alignment markers, mechanical stops, active alignment, etc. Other optical components which may require such precision alignment include optical components such as semiconductor optical amplifiers.

Such integration of optical components which requires precision alignment is cost ineffective and difficult to scale.

There is a general desire for improved systems and methods for integrating laser diodes (or other light sources or optical components) onto a semiconductor chip. There is also a general desire for systems and methods for integrating laser diodes (or other light sources or optical components) onto a semiconductor chip which are cost effective and scalable.

SUMMARY

This invention has a number of aspects. These include, without limitation:

semiconductor chips comprising optical components integrated with photonic wire bonds;
semiconductor chips comprising optical components integrated with polymer lenses;
methods for fabricating semiconductor chips comprising optical components.

One aspect of the invention provides a method for fabricating a semiconductor chip with an integrated laser diode. The method may comprise fabricating a recess shaped to receive the laser diode. The method may also comprise metallizing at least one surface of the recess. The method may also comprise coupling the laser diode to the at least one metallized surface of the recess. The laser diode may comprise a p-type semiconductor and an n-type semiconductor. The n-type semiconductor may be electrically coupled to the at least one metallized surface of the recess. The method may also comprise optically coupling an optical output of the laser diode to an optical input of a photonic interface of the chip with a photonic wire bond.

One or both of the at least one metallized surface of the recess and the p-type semiconductor of the laser diode may be electrically coupled to corresponding electrical connection surfaces of the chip with electrical wire bonds.

The method may comprise forming the electrical wire bonds prior to forming the photonic wire bond.

The method may comprise enclosing the photonic wire bond and the electrical wire bonds in a protective cladding.

The method may comprise enclosing the photonic wire bond in a protective cladding prior to forming the electrical wire bonds.

The recess may comprise angled side walls and metallizing at least one surface of the recess may comprise metallizing the angled sidewalls.

The method may comprise electrically coupling the metallized angled side walls of the recess to a corresponding electrical connection surface of the chip.

Coupling the laser diode to the at least one metallized surface of the recess may comprise soldering the n-type semiconductor of the laser diode to the at least one metallized surface of the recess.

Soldering the n-type semiconductor of the laser diode may comprise performing reflow soldering.

Fabricating the recess may comprise at least partially etching a silicon handle layer of the chip. At least partially etching a silicon handle layer of the chip may comprise performing a dry or wet etch. Performing a dry etch may comprise performing a Bosch etch. Performing a wet etch may comprise etching the silicon handle layer with potassium hydroxide (KOH) or tetramethylammonium hydroxide (TMAH).

Fabricating the recess may comprise fabricating the recess to receive the laser diode such that a height offset between a facet of the laser diode and a silicon device layer of the chip is less than a threshold amount. The threshold amount may be less than about 30 μm.

The coupling efficiency of the photonic wire bond may be about 0.7 dB.

The method may comprise fabricating one or more additional recesses. The one or more additional recesses may be configured to confine a position of photonic wire bond cladding relative to the chip. The one or more additional recesses may be fabricated concurrently with the recess configured to receive the laser diode. The method may comprise etching the one or more additional recesses.

Another aspect of the invention provides a method for fabricating a semiconductor chip with an integrated optical component. The method may comprise fabricating a recess or bore shaped to receive the optical component. The method may also comprise metallizing at least one surface of the recess or bore. The method may also comprise coupling the optical component to the at least one metallized surface of the recess or bore. The method may also comprise optically coupling the optical component to a photonic interface of the chip with one or both of a photonic wire bond and at least one polymer lens.

Further aspects and example embodiments are illustrated in the accompanying drawings and/or described in the following description.

It is emphasized that the invention relates to all combinations of the above features, even if these are recited in different claims.

BRIEF DESCRIPTION OF THE DRAWINGS

The accompanying drawings illustrate non-limiting example embodiments of the invention.

DETAILED DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive sense.

Figure 1:
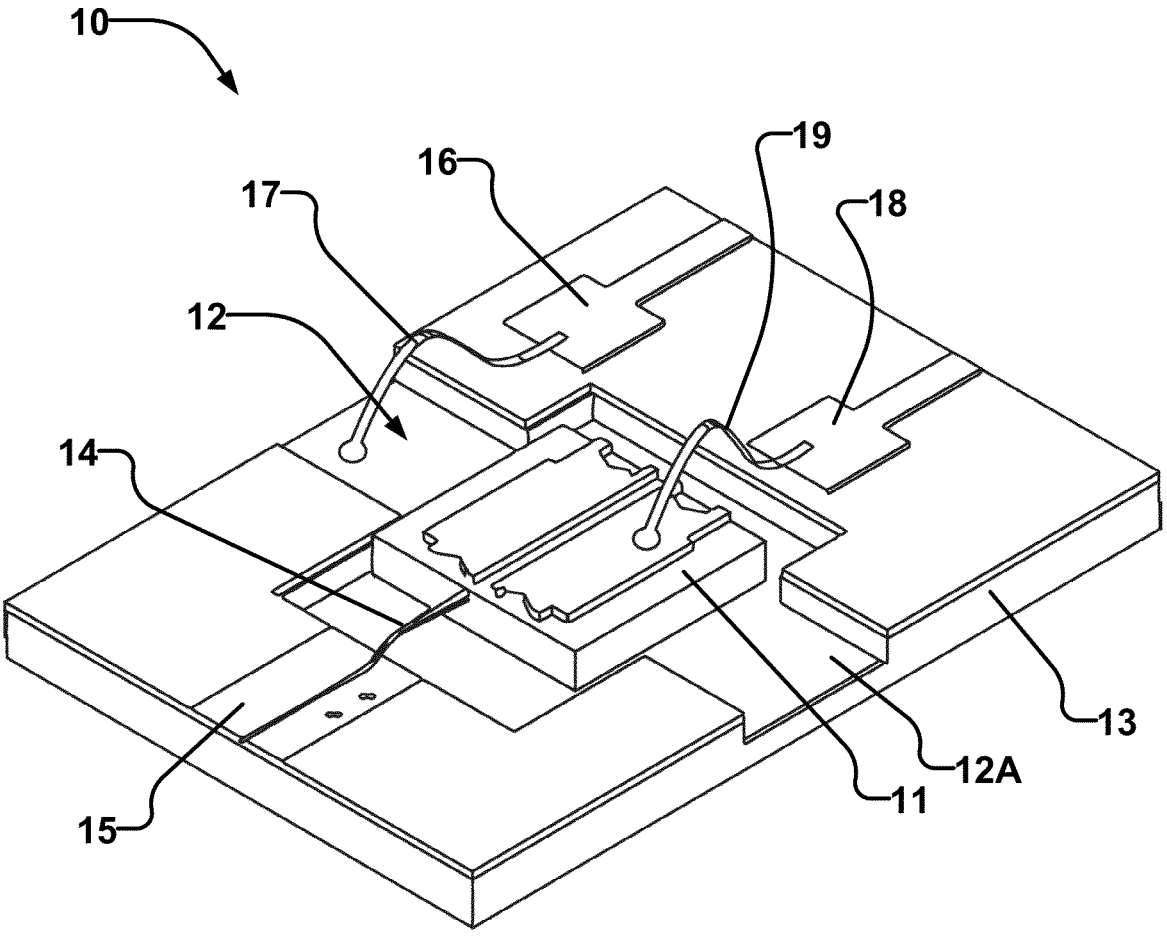
FIG. 1 is a schematic illustration of a semiconductor chip according to an example embodiment of the invention.

FIG. 1 schematically illustrates an example system in package (SIP) semiconductor chip 10. Chip 10 may, for example, be made using a silicon on insulator (SOI) fabrication process.

Chip 10 comprises a laser diode 11 (or other optical component). Laser diode 11 typically comprises p-type semiconductor, n-type semiconductor and a p-n junction between the p-type semiconductor and the n-type semiconductor. An end of laser diode 11 corresponding or proximate to the p-type semiconductor may be referred to as the "p-side" of the laser diode and an opposing end of the laser diode corresponding or proximate to the n-type semiconductor may be referred to as the "n-side" of the laser diode. Laser diode 11 comprises an optical output which outputs light generated by laser diode 11. In some embodiments laser diode 11 comprises an optical waveguide which guides light generated by laser diode 11 to the optical output of laser diode 11. In some embodiments laser diode 11 comprises a III-V laser diode.

Laser diode 11 is positioned within a recess 12 such that the p-side of laser diode 11 is away from silicon handle layer 13 (e.g. the n-side of laser diode 11 is proximate to silicon handle layer 13 or partially within silicon handle layer 13).

A photonic wire bond 14 optically couples an optical output of laser diode 11 to an optical input of photonic interface 15 of chip 10. In some embodiments photonic interface 15 comprises silicon photonics. In some embodiments photonic wire bond 14 optically couples an optical waveguide of laser diode 11 to photonic interface 15. Photonic interface 15 may comprise one or more silicon photonics such as a surface waveguide coupler, waveguide, grating coupler, edge coupler, filter, resonator, modulator, etc. Such silicon photonics may be located proximate to the location where photonic wire bond 14 is coupled to photonic interface 15. The silicon photonics of photonic interface 15 may also be coupled to an optical fiber, an optical fiber array, etc. via one or more photonic wire bonds, free space and/or the like.

Although chip 10 has been described and illustrated as having a single photonic wire bond 14, chip 10 may comprise two or more photonic wire bonds 14.

One or more surfaces 12A of recess 12 are metallized. In currently preferred embodiments, at least the bottom surface (e.g. base or end surface) of recess 12 is metallized. Laser diode 11 may be electrically coupled to metallized surface 12A. For example, the n-side of laser diode 11 may be electrically coupled to metallized surface 12A. In some embodiments laser diode 11 is at least partially physically coupled to chip 10 via metallized surface 12A. Metallized surface 12A may be electrically coupled to a corresponding electrical connection surface (e.g. pad) 16 of chip 10. In some embodiments metallized surface 12A is coupled to electrical connection surface 16 with an electrical wire bond 17. In some embodiments metallized surface 12A is coupled to electrical connection surface 16 with a metallized angled sidewall of recess 12 as described elsewhere herein.

The p-side of laser diode 11 may be electrically coupled to a corresponding electrical connection surface (e.g. pad) 18 of chip 10. In some embodiments the p-side of laser diode 11 is electrically coupled to electrical connection surface 18 with an electrical wire bond 19.

In some embodiments chip 10 comprises silicon handle layer 13 (e.g. comprising silicon (Si)), a buried oxide layer (e.g. comprising silicon dioxide ($SiO_2$)), a silicon device layer (e.g. comprising silicon (Si)) and an oxide cladding layer (e.g. comprising silicon dioxide ($SiO_2$)).

One aspect of the invention described herein provides an SOI fabrication method for fabricating a SIP chip having a laser diode (or other optical component). By placing the p-side of the laser diode away from the silicon handle layer of the chip (e.g. the n-side of the laser diode is proximate the silicon handle layer or partially within the silicon handle layer) and coupling the optical output (e.g. an output of an optical waveguide) of the laser diode to silicon photonics of the chip with a photonic wire bond, integration of the laser diode with the remainder of the chip is simplified. For example, a recess configured to receive the laser diode may be fabricated with higher tolerances (e.g. greater spatial variations), therefore reducing time, expense and/or difficulty associated with fabricating the recess and integrating the laser diode (or other optical component) into the chip.

Figure 2:
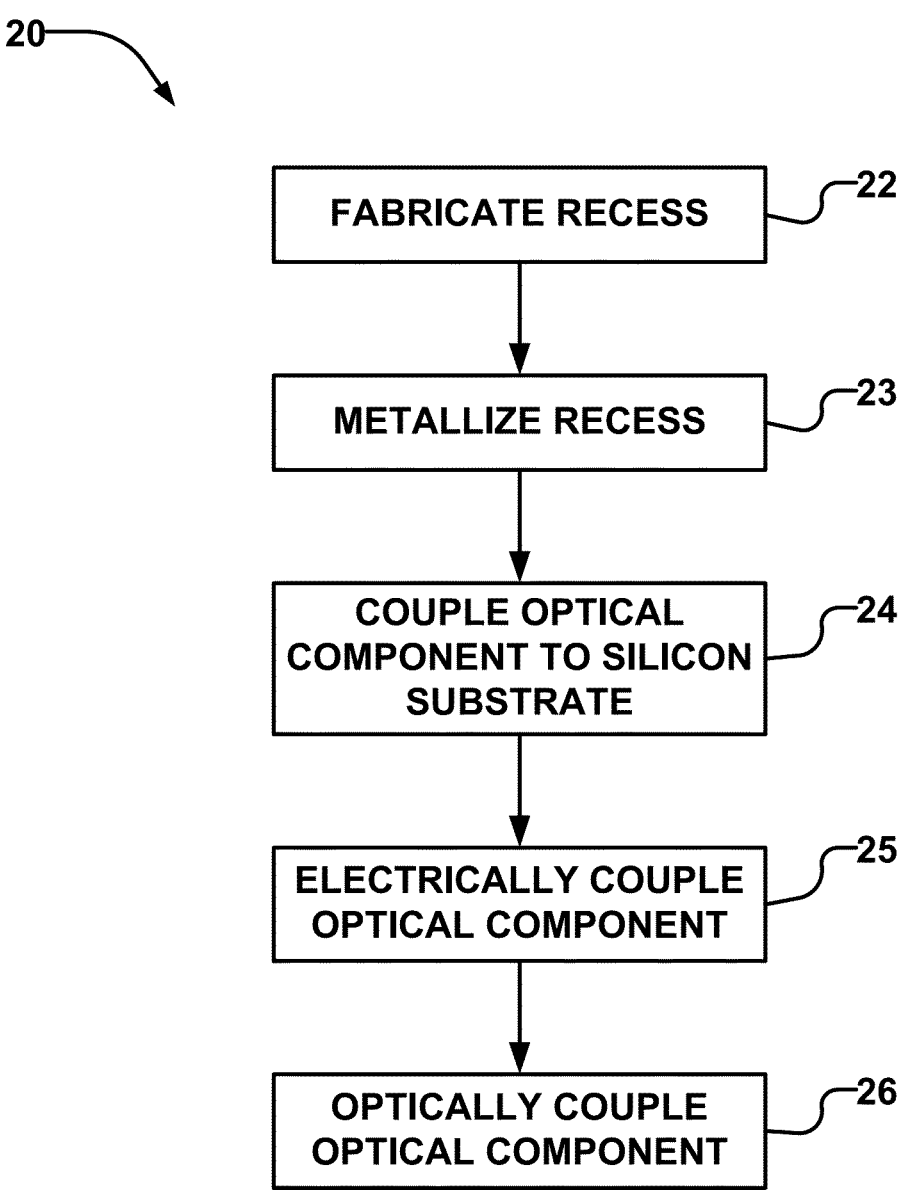
FIG. 2 is a block diagram illustrating a method according to an example embodiment of the invention.

FIG. 2 is a block diagram flowchart which illustrates an example method 20 for fabricating a chip comprising a laser diode (or other optical component). In some embodiments method 20 is performed to fabricate example chip 10.

In block 22 a recess (e.g. recess 12) configured to receive the laser diode is fabricated.

Once the recess is fabricated, one or more surfaces of the recess are metallized in block 23 creating at least one electrically conductive surface which may be electrically coupled to the laser diode (e.g. the n-side of the laser diode). Metallization of the recess may, for example, comprise covering one or more surfaces of the recess with a metal or metal-based compound. In currently preferred embodiments, at least the bottom surface (e.g. base or end surface) of the recess is metallized.

Block 23 may also comprise fabrication of other electrical components of the chip (e.g. electrical traces, electrical connection surface(s) for coupling the laser diode to a circuit of the chip, etc.) by performing one or more metallization processes. In some embodiments a metallization process used to metallize one or more surfaces of the recess may concurrently fabricate one or more other electrical components of the chip. In some embodiments, block 23 comprises performing a plurality of metallization processes to deposit different metals. For example, the chip may comprise indium traces and gold traces.

In block 24 the laser diode is positioned within the recess and coupled to the chip. As described elsewhere herein the laser diode may be positioned within the recess such that the p-side of the laser diode is away from the silicon handle layer of the chip (e.g. the n-side of laser diode is proximate to the silicon handle layer or partially within the silicon handle layer). The n-side of the laser diode may, for example, be coupled to the metallized bottom surface (e.g. base or end surface) of the recess. In some embodiments the n-side of the laser diode is soldered to the metallized bottom surface (e.g. base or end surface) of the recess.

One or more electrical connections may be formed in block 25. For example, the p-side of the laser diode may be electrically coupled to a corresponding electrical connection surface (e.g. electrical connection surface 18). As another example, the metallized bottom surface (e.g. base or end surface) of the recess may be electrically coupled to its corresponding electrical connection surface (e.g. electrical connection surface 16). Block 25 may, for example, comprise fabricating one or more electrical wire bonds to form the electrical connections.

In block 26 an optical output of the laser diode is optically coupled to silicon photonics of the chip (e.g. photonic interface 15). In some embodiments block 26 comprises fabricating a photonic wire bond between the optical output of the laser diode and an optical input of the photonic interface (which may comprise one or more silicon photonics as described elsewhere herein) of the chip to optically couple the laser diode to the photonic interface. In some embodiments block 26 comprises fabricating a photonic wire bond between the optical output of an optical waveguide of the laser diode and an optical input of the photonic interface of the chip to optically couple the laser diode to the photonic interface.

In currently preferred embodiments, all connections other than the photonic wire bond(s) (e.g. electrical wire bonds, etc.) are formed prior to the photonic wire bond(s) of block 26 being formed. It is preferable for all connections other than the photonic wire bond(s) to be formed prior to the photonic wire bond(s) being formed to avoid damaging the photonic wire bond(s) while making the other connections. However, this is not mandatory. In some embodiments a photonic wire bond is formed prior to at least one other connection (e.g. an electrical wire bond) being formed. In some embodiments the photonic wire bond is protected (e.g. by applying a protective cladding layer to the photonic wire bond) to minimize the likelihood of the photonic wire bond being damaged during the remainder of the fabrication process. In some embodiments a photonic wire bond is formed concurrently with at least one other connection.

Although example chip 10 and example method 20 have been described with reference to a laser diode (e.g. laser diode 11), it is emphasized that the systems and methods described herein are not limited to a laser diode. The laser diode may be replaced with an alternative light source or optical component.

Method 20 may advantageously reduce a topology of chip 10. Since laser diode 11 is positioned within recess 12, an amount by which laser diode 11 extends beyond a top, outer or outermost surface of the SOI wafer may be reduced or eliminated. By reducing a topology of chip 10 (e.g. the amount by which laser diode 11 extends beyond a top, outer or outermost surface of the wafer) scalability of fabrication of method 20 may be increased as additional processing steps that typically require low topology substrates (e.g. spin-coating resist, metal liftoff processes, chip dicing, etc.) may, for example, be more easily performed.

Additionally, or alternatively, method 20 may be performed on a wafer scale thereby increasing scalability of fabrication.

Individual steps of method 20 will now be described in further detail with reference to the silicon on insulator (SOI) material platform as an example.

Fabrication of Recess

A thickness of the laser diode (or other optical component) will typically determine a depth of a recess such that the optical output of the laser diode has a height difference compared to the optical input of the photonic interface that is less than a threshold amount (e.g. a height difference of less than about 30 μm in currently preferred embodiments) to avoid small radius of curvature photonic wire bonds. For example, in the telecommunications field, a small radius of curvature of a photonic wire bond may be a radius of curvature that is less than about 80 μm. A recess which does not extend into the silicon handle layer may be referred to as a "shallow" recess. In some such embodiments, the shallow recess may be defined using a photolithography process. For example, photolithography with positive tone photoresist may be used. Once the pattern for the recess is defined layers above the silicon handle layer may be etched to fabricate the recess. For example, a reactive ion etching process may be used to etch through an oxide cladding layer, a silicon device layer and a buried oxide layer.

Figures 3A, 3B, 3C:
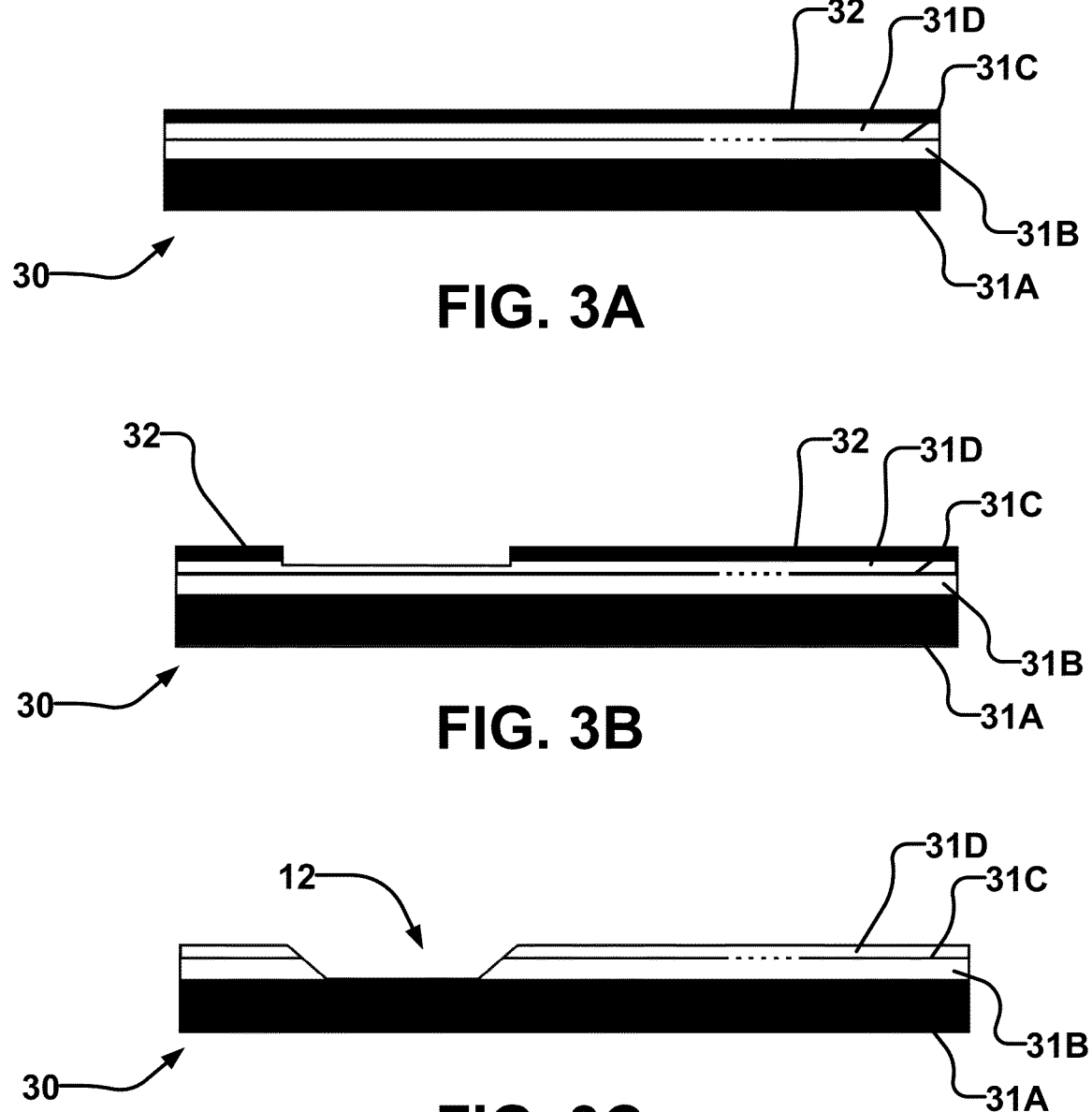
FIGS. 3A to 3C schematically illustrate an example fabrication process for fabricating a recess.

FIGS. 3A-3C schematically illustrate an example process for fabricating recess 12 in example silicon wafer 30. Silicon wafer 30 comprises silicon handle layer 31A, silicon dioxide layer 31B (e.g. a buried oxide layer), silicon layer 31C (e.g. a silicon device layer) and silicon dioxide layer 31D (e.g. an oxide cladding layer). In the example case illustrated by FIGS. 3A to 3C, recess 12 does not extend into silicon handle layer 31A (i.e. recess 12 is a shallow recess).

In FIG. 3A a photoresist 32 is spin coated over silicon dioxide layer 31D.

In FIG. 3B photolithography is performed to define a pattern for recess 12 within photoresist 32. In some embodiments the photolithography has a feature size of about 300 μm. In some embodiments the photolithography comprises maskless lithography.

In FIG. 3C a dry etch to silicon handle layer 31A is performed to fabricate recess 12 within layers 31B, 31C and 31D. In some embodiments the dry etch may be performed with a reactive ion etcher. In some embodiments performing the dry etch may comprise performing a dry etch with the Rapier™ Deep Reactive Ion Etcher (DRIE) system available at 4D LABS at Simon Fraser University in British Columbia, Canada.

In some embodiments the vertically of the sidewalls of the oxide cladding layer, the silicon device layer and the buried oxide layer (e.g. layers 31B, 31C and 31D) defining recess 12 is variable. For example, the vertically of the sidewalls may be controlled by varying a sidewall profile of the photoresist (e.g. photoresist 32). Angled sidewalls of the oxide cladding layer, the silicon device layer and the buried oxide layer may be produced by performing a thermal resist reflow step after development of the photoresist but before commencing etching of the oxide cladding layer, the silicon device layer and the buried oxide layer. In some embodiments recess 12 comprises generally vertical sidewalls.

If the laser diode (or other optical component) is thick (e.g. has a height that would result in a height offset of the optical output of the laser diode compared to the optical input of the photonic interface when placed on top of the silicon handle layer (e.g. layer 31A) that is greater than a threshold amount (e.g. a height difference greater than about 30 μm)), the recess configured to receive the laser diode (or other optical component) extends into the silicon handle layer in order for a height offset between the optical output of the laser diode and the optical input of the photonic interface to be less than a threshold amount (e.g. a height offset of less than about 30 μm) so that a viable photonic wire bond may be created. A recess which extends into the silicon handle layer may be referred to as a "deep" recess. In some such embodiments, photolithography with positive tone photoresist may be performed to define a pattern of the deep recess. Reactive ion etching may, for example, then be performed to etch through the oxide cladding layer, silicon device layer and buried oxide layer as described above.

To etch into the silicon handle layer wet or dry etching may be performed. For example, to fabricate a deep recess with generally vertical sidewalls a standard Bosch etch process may be performed with a photoresist mask. The Bosch etch process may comprise an etching process as described in, for example, U.S. Pat. Nos. 5,501,893, 6,531,068 and/or 6,284,148. To fabricate a deep recess with angled sidewalls a wet, for example, potassium hydroxide (KOH) or tetramethylammonium hydroxide (TMAH) may be performed with a hard mask.

Figure 4A:
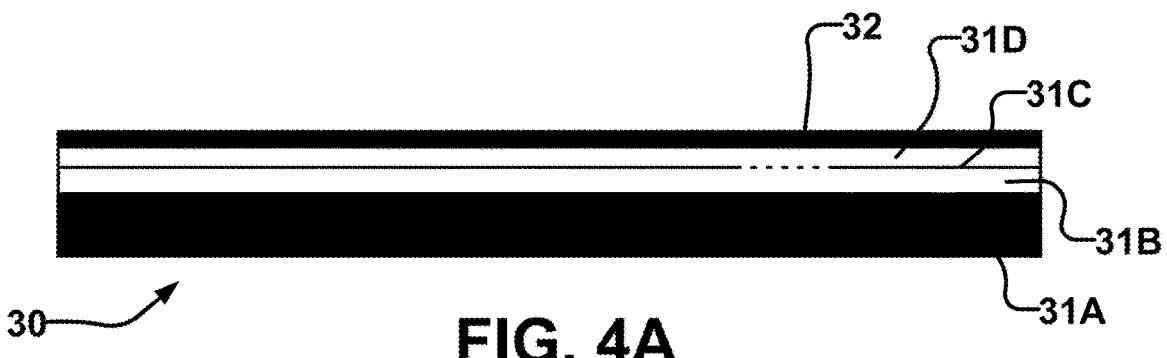
FIGS. 4A to 4C schematically illustrate an example fabrication process for fabricating a recess.
Figure 4B:
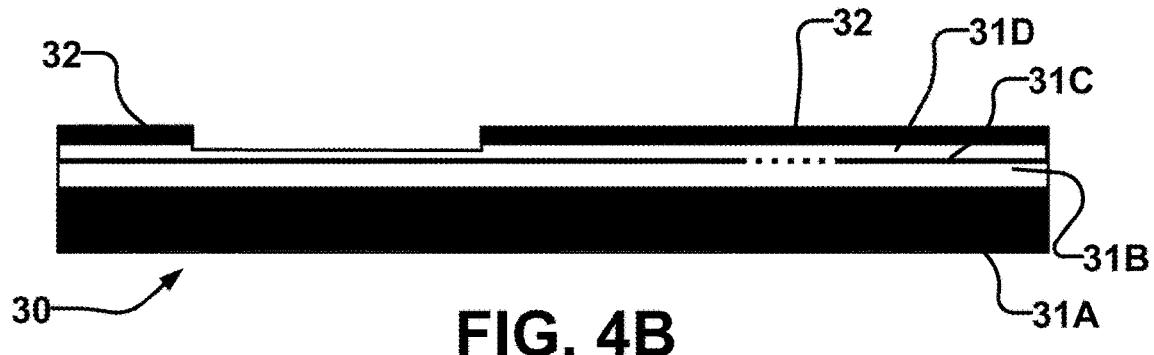
Figure 4C:
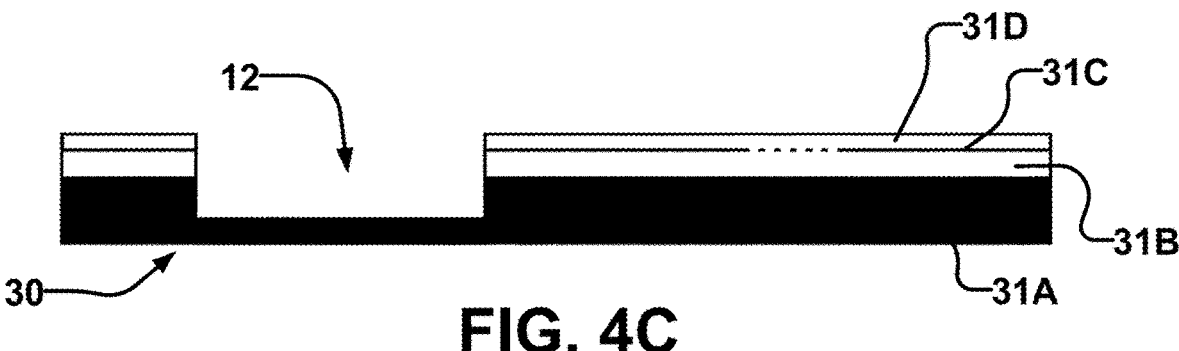

FIGS. 4A-4C schematically illustrate an example process for fabricating an example deep recess as recess 12 in example silicon wafer 30. The example process illustrated in FIGS. 4A-4C comprises performing a Bosch etching process. The Bosch etching process may comprise rapid switching of passivation and etch steps to quickly etch through silicon (e.g. silicon handle layer 31A). The Bosch process may be highly selective to silicon over photoresist. This high selectivity enables, for example, the use of a photoresist mask that is about 5 μm thick to etch more than about 100 μm into silicon handle layer 31A.

In FIG. 4A photoresist 32 is spin coated over silicon dioxide layer 31D.

In FIG. 4B photolithography is performed to define a pattern for recess 12 within photoresist 32. In some embodiments the photolithography comprises maskless lithography. In some embodiments the photolithography has a feature size of about 300 μm.

In FIG. 4C layers 31A, 31B, 31C and 31D are etched to fabricate deep recess 12. As described elsewhere herein the etching may comprise performing a Bosch etch. In some embodiments the etch is performed with an etcher that is configurable to perform a Bosch etch. In some embodiments the etch is performed with the Rapier™ Deep Reactive Ion Etcher (DRIE) system available at 4D LABS at Simon Fraser University in British Columbia, Canada.

Figure 5A:
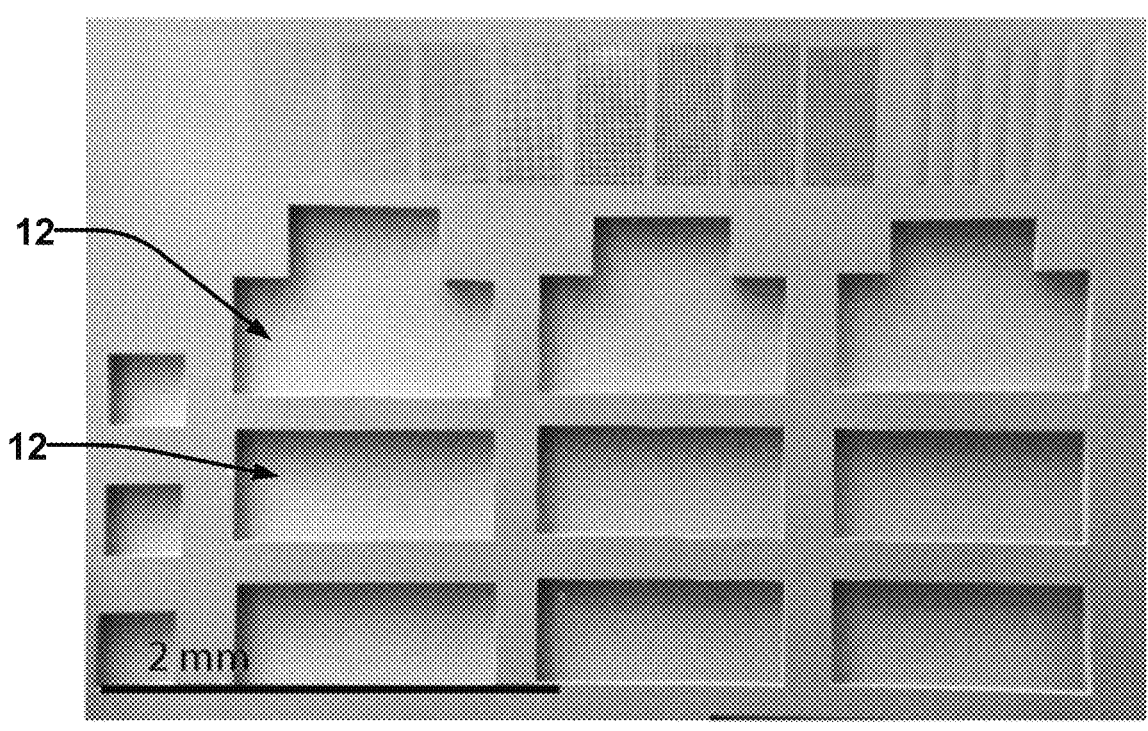
FIG. 5A illustrates example recesses etched into a silicon on insulator (SOI) wafer using the example process of FIGS. 4A-4C.
Figure 5B:
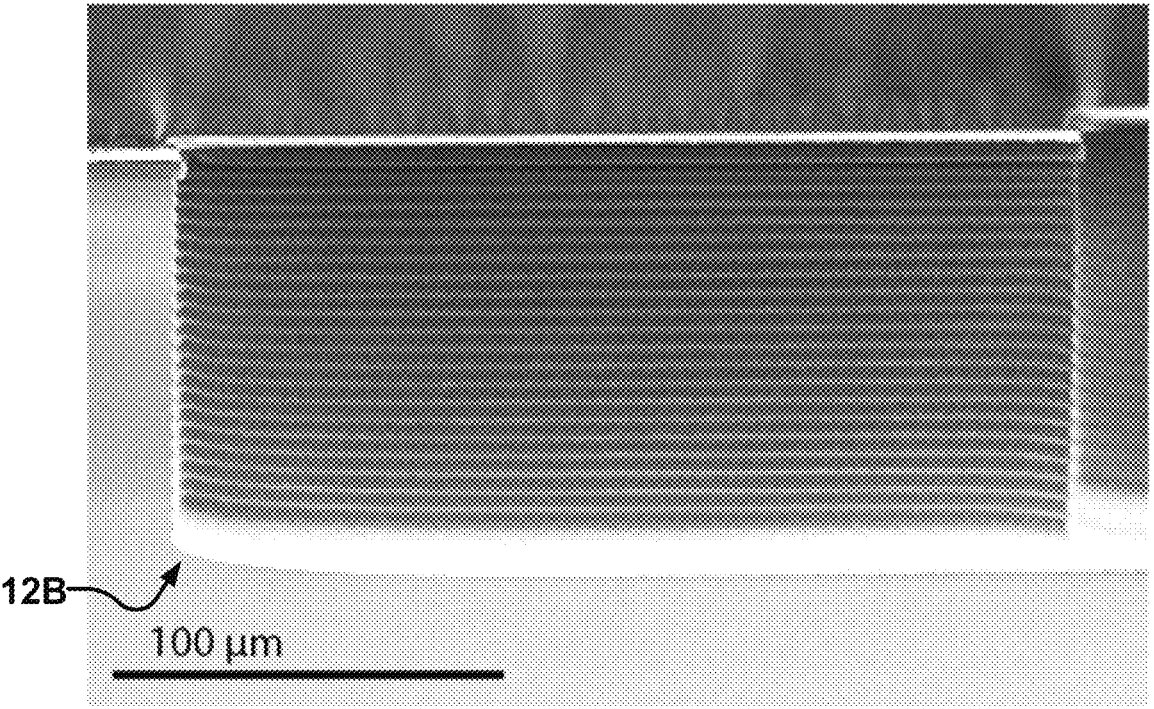
FIG. 5B illustrates a sidewall of an example recess of FIG. 5A.

FIGS. 5A and 5B illustrate an example test chip fabricated with the example etching process illustrated in FIGS. 4A-4C. FIG. 5A illustrates example recesses etched into a SOI wafer. Characteristic scallops in the sidewalls of one of the recesses from FIG. 5A associated with a Bosch etching process are shown in FIG. 5B. As only the bottom surface (e.g. base or end surface) of such example recess is typically metallized the sidewall angle or roughness may not be a concern. As shown by edge contour 12B in FIG. 5B a bowl shape of the bottom surface (e.g. base or end surface) of the recess may also be present. The bowl shaped bottom surface (e.g. base or end surface) may result in a height difference of, for example, about 6 μm in the bottom surface (e.g. base or end surface) of the recess measured at the vertical sidewall compared to the height of the recess at the center of the recess. This height offset may have implications for coupling the laser diode (or other optical component) into the recess.

FIGS. 6A-6D schematically illustrate an example process for fabricating an example deep recess with angled sidewalls as recess 12 in example silicon wafer 30.

Figures 6A, 6B, 6C, 6D:
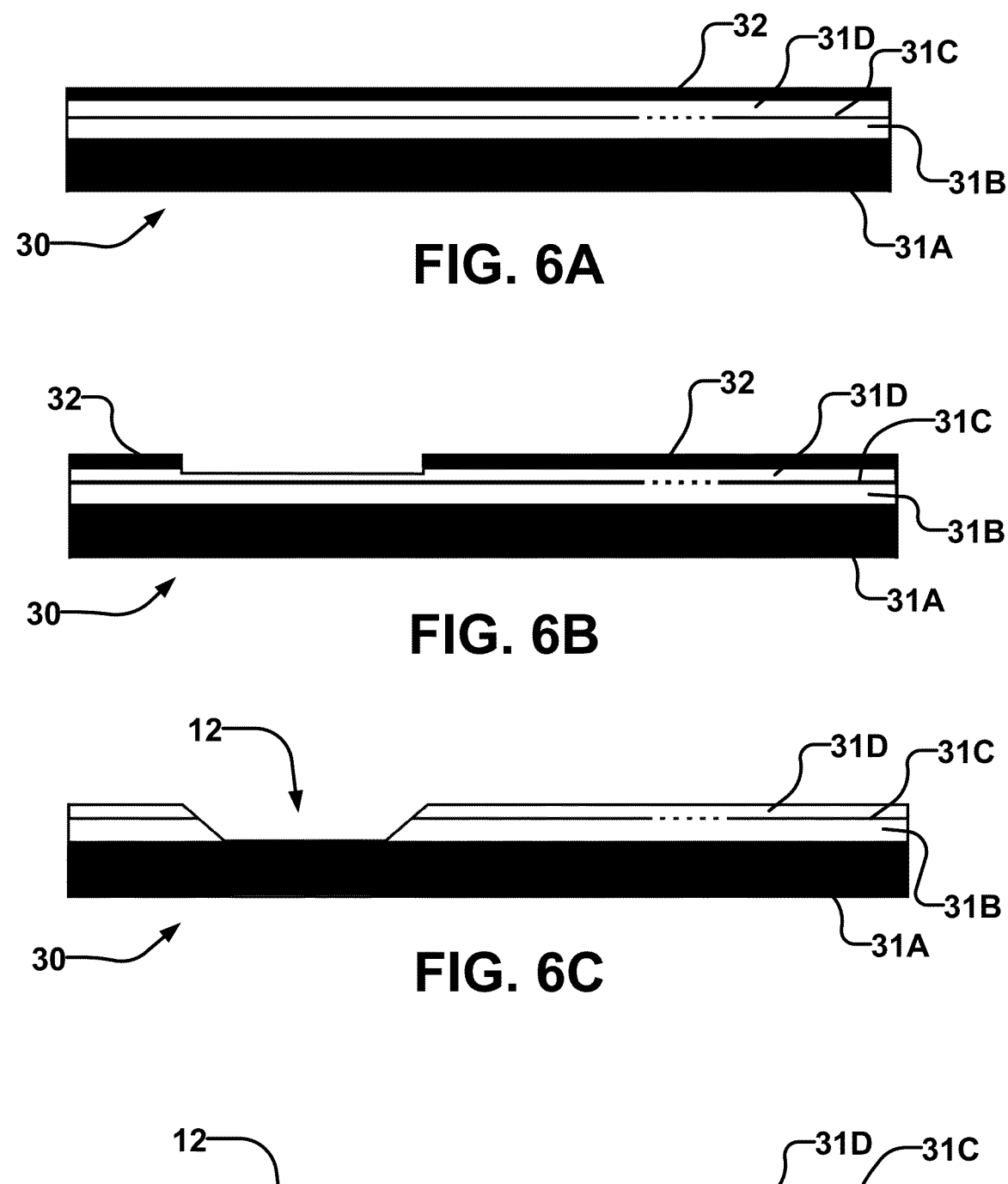
FIGS. 6A to 6D schematically illustrate an example fabrication process for fabricating a recess.

FIGS. 6A-6C illustrate the same process as FIGS. 3A-3C respectively.

Once silicon handle layer 31A is exposed by the dry etch of FIGS. 6A-6C, a wet etching process may be performed to fabricate the deep recess as shown in FIG. 6D. In some embodiments tetramethylammonium hydroxide (TMAH) is used as the wet etchant. In some embodiments potassium hydroxide (KOH) is used as the wet etchant. In some embodiments the wet etch comprises anisotropic etching of silicon.

As TMAH and KOH may be a very effective photoresist stripper, a hard mask may be used to protect the silicon of silicon handle layer 31A that is not to be etched. In some embodiments cladding oxide layer 31D may be used as the hard mask. For example, TMAH has a negligible etch rate of silicon dioxide ($SiO_2$) and therefore cladding oxide layer 31D may be used as the hard mask.

The wet etch of FIG. 6D results in a smooth etched silicon surface due to the chemical nature of the etch. As the etch rates vary along different crystal planes of the silicon crystal of silicon handle layer 31A, the different planes may be revealed after etching. An angle between the sidewalls and a plane corresponding to the bottom surface (e.g. base or end surface) of recess 12 may be 54.7° (e.g. about 55°). To metallize angled sidewalls, an angle (measured between a sidewall and the plane corresponding to the bottom surface (e.g. base or end surface) of recess 12) in the range from about 0° to about 88° is typically desirable.

As silicon device layer 31C sandwiched between buried oxide layer 31B and cladding layer 31D may also be etched by the TMAH (or other wet etchant), a sufficient area around the recess may be clear of any silicon photonic structures. If an electrical connection to the top, outer or outermost surface of the chip is desired a second round of $SiO_2/Si/SiO_2$ etching may be performed to remove the overhanging top layers created by the TMAH (or other wet etchant) undercut.

Figure 7A:
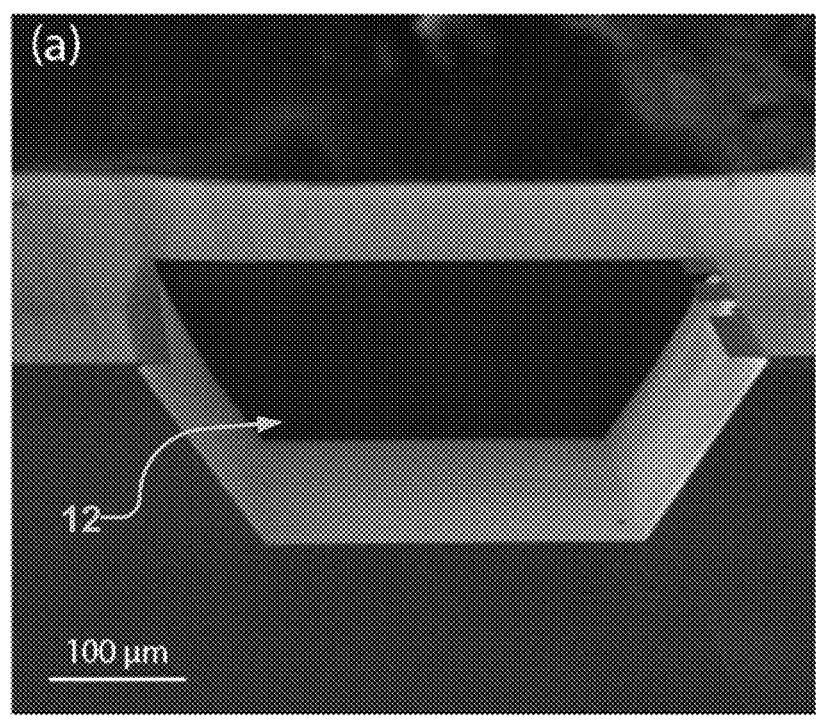
FIGS. 7A and 7B illustrate example deep recesses formed by performing a wet etch process using tetramethylammonium hydroxide (TMAH).
Figure 7B:
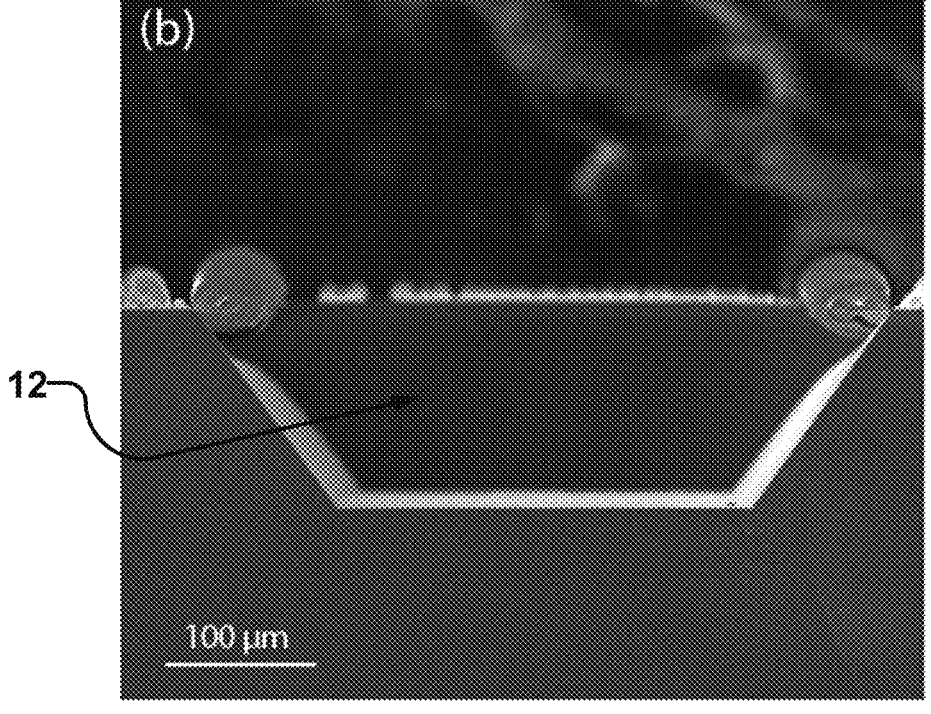

FIGS. 7A and 7B illustrate example deep recesses formed by performing a wet etch process using TMAH. In the example cases shown by FIGS. 7A and 7B, buried oxide layers 31B were used as the hard mask.

In some embodiments recess 12 comprises a geometry or configuration that is designed to accommodate laser diode 11 (or other optical component) which will be coupled into recess 12. The geometry or configuration may include sufficient space for an electrical wire bonds that will be made to a metallized bottom (e.g. base or end) of recess 12 (or other metallized surfaces of recess 12). Additionally, or alternatively, the geometry or configuration may be designed to facilitate preventing or reducing production of bubbles in photonic wire bond resist used during the formation of a photonic wire bond as described elsewhere herein.

Metallization of Recess

In some embodiments a liftoff process is performed to deposit a thin (e.g. less than about 1 μm in some cases) layer of metal such as indium, gold, etc. in the recess to metallize one or more surfaces of recess 12. The liftoff process may comprise spin-coating a thin layer of positive-tone photoresist over wafer 30 (e.g. over layer 31D). Recessed areas of the chip may then be exposed. For example, photolithography may be performed to expose the recessed areas. In some embodiments the photolithography comprises maskless lithography. Once the recessed areas are exposed, metal may be deposited. For example, indium, gold, etc. may be deposited by performing physical vapor deposition. Once the metal is deposited, liftoff may be performed.

If recess 12 comprises angled sidewalls (e.g. sidewalls with angles less than about 90° measured between a sidewall and the plane corresponding to the bottom surface (e.g. base or end surface) of recess 12), metal may also be deposited on one or more of the sidewalls. By depositing metal on the sidewalls, an electrical connection between the bottom surface (e.g. base or end surface) of recess 12 and a top, outer or outermost surface of chip 10 via one or more of the metallized angled sidewalls may be created.

FIGS. 8A-8E schematically illustrate an example process for metallizing one or more surfaces of recess 12.

Figures 8A, 8B, 8C, 8D, 8E:
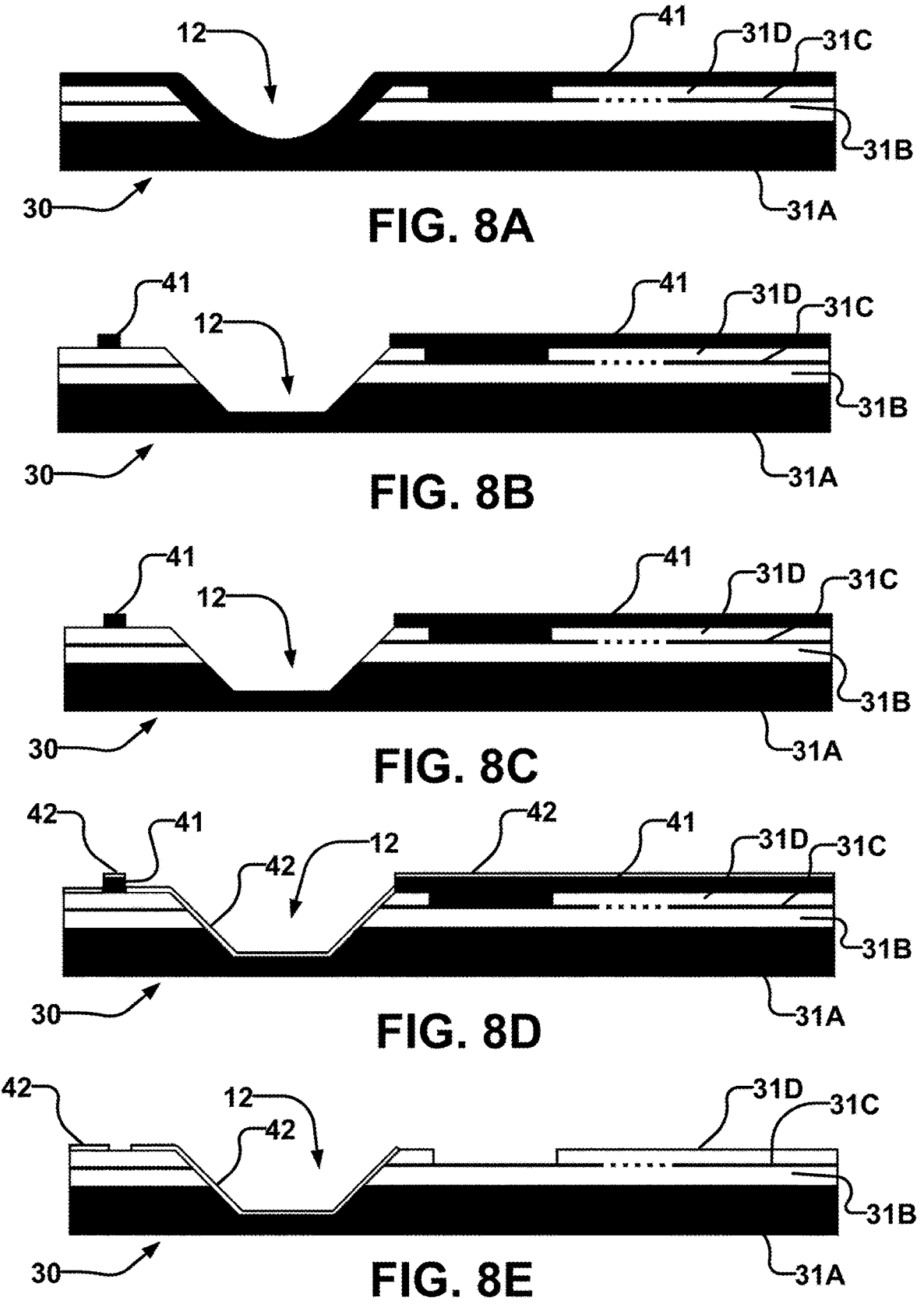
FIGS. 8A to 8E schematically illustrate an example process for metallizing one or more surfaces of a recess.

In FIG. 8A a photoresist layer 41 is spin coated over layer 31D.

In FIG. 8B photolithography is performed to expose surfaces to be metallized. In some embodiments the photolithography comprises maskless lithography. In some embodiments the photolithography has a feature size of about 300 μm.

In FIG. 8C a descum process is performed to remove residue of photoresist layer 41. In some embodiments the descum process comprises an $O_2$ descum process.

In FIG. 8D physical vapor deposition (and/or other suitable deposition process) of metal is performed.

In FIG. 8E liftoff is performed. As shown in FIG. 8E, surfaces of recess 12 are metallized with a metal layer 42 comprising indium, gold and/or the like.

A shallow recess may result in a flat bottom surface (e.g. base or end surface) of recess 12. In some such cases a thin layer of indium (e.g. less than about 25.4 μm) may be utilized to directly solder the laser diode (or other optical component) to silicon handle layer 31A. Advantageously, indium comprises a low melting point (165° C.). Additionally, indium is vacuum and cryogenic compatible. If a different metal is used to metallize the recess (i.e. a metal other than indium) additional solder material such as, for example, a solder preform or epoxy may also be used for coupling the laser diode (or other optical component) into the recess.

In some embodiments indium (or another metal or metal alloy such as for example AuSn) is placed manually on one or more surfaces of recess 12 to metallize one or more surfaces of recess 12. For example, a small piece of indium cut from a larger indium ribbon or indium balls may be placed on one or more surfaces of recess 12. In some embodiments the metal (or metal alloy) is placed manually using a needle, a vacuum pickup tool, tweezers, etc. Placing metal (or metal alloy) manually may be feasible as recess 12 may be hundreds of micrometers wide and/or long.

In some embodiments solder paste is placed manually on one or more surfaces of recess 12 to metallize one or more surfaces of recess 12. The solder paste may comprise minute solder spheres held within a specialized form of solder flux. In some such cases, it may be desirable to avoid contamination of one or more of the optical inputs and outputs by solder flux residue. The solder paste may be dispensed manually using a needle.

In some embodiments solder paste (or other solderable material) is applied to the laser diode (or other optical component) prior to the laser diode (or other optical component) being placed into recess 12.

In some embodiments solder paste may be applied to one or more surfaces of recess 12 using a screen or mask. The screen or mask may comprise apertures that match locations of recesses on a wafer. A size of an aperture may be designed to allow only a small amount of solder paste to be transferred to recess 12 on the wafer below the screen or mask.

In some embodiments solder paste may be applied to one or more surfaces of recess 12 by using a microdispensing system. The microdispensing system may be configured to dispense less than about 150 μm drops of solder paste onto the one or more surfaces of recess 12.

A solder paste described herein may, for example, comprise indium.

In some embodiments one or more metals are printed onto one or more surfaces of recess 12 to metallize one or more surfaces of recess 12. For example, one or more metals to be printed may be suspended in ink. A system such as the XTPL® Delta Printing System may be used to print the one or more metals onto one or more surfaces of recess 12. In some such embodiments feature sizes down to about 1 μm may be possible. Additionally, or alternatively, such systems may provide precise control of where a metal is deposited. In some embodiments such systems may be used to route metal from recess 12 to a top, outer or outermost surface of chip 10 to route to electrical connection bond pads.

In currently preferred embodiments, only the bottom surface (e.g. base or end surface) of a deep recess comprising generally vertical sidewalls is metallized.

For a deep recess fabricated using a Bosch etch process, the same photoresist mask that was used for the Bosch deep etch may be used in a liftoff process (e.g. the liftoff process described elsewhere herein) to, for example, deposit a metal layer to metallize one or more surfaces of recess 12. For example, an indium metal layer, an intermediate gold layer upon which a different solder material can be placed, etc. may be deposited to metallize one or more surfaces of recess 12. For the intermediate layer typically a thin (e.g. about 5-10 nm) adhesion layer of titanium (Ti) or chromium (Cr) may be deposited via physical vapor deposition, followed by about a 100 nm thick gold (Au) layer. A solder preform made of gold/tin (Au/Sn) (e.g. typically 80% Au, 20% Sn alloy) may then, for example, be placed in recess 12 with a pick and place tool. In some embodiments alternative soldering materials such as silver epoxy, other gold alloys, etc. are used. The laser diode may then be coupled to chip 10 by placing it on top of the preform and performing a reflow soldering step as described elsewhere herein.

When spin coating photoresist for a liftoff process the deep recess may cause non-uniformity of the photoresist thickness. In some such cases, negative-tone photoresist may be used such that the un-exposed resist in the deep recess can be easily washed away during the development step. Alternatively, a high exposure dose may be used with positive resist to clear all resist from the recess. A desired dose may depend, for example, on any one or more of the type of resist, the thickness of the resist and/or the like. Typically, an exposed resist film thickness increases approximately linearly relative to the exposure dose. The liftoff process may then proceed as described elsewhere herein. Spray coating of photoresist may also be used instead of spin coating to create a conformal layer of photoresist in recess 12 that may be more easily patterned.

Figure 9A:
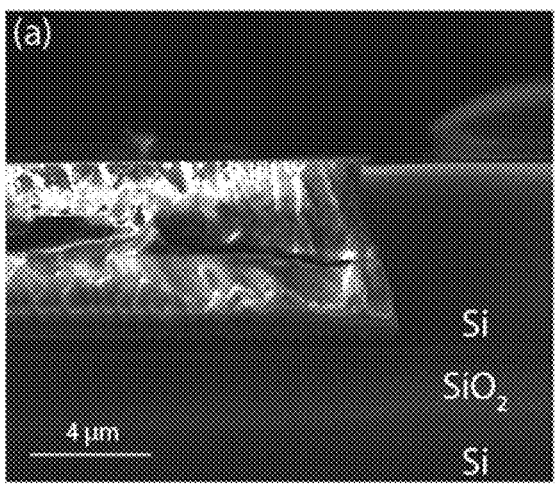
FIGS. 9A-9F are scanning electron micrographs illustrating an effect of resist reflow on sidewall profile of a shallow recess of the silicon device layer and buried oxide layer after example etching and indium deposition.
Figure 9B:
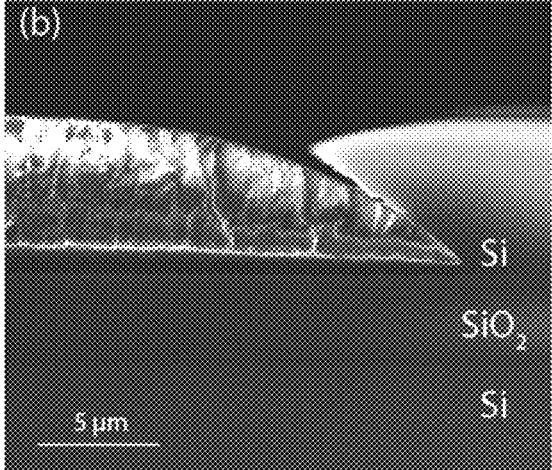
Figure 9C:
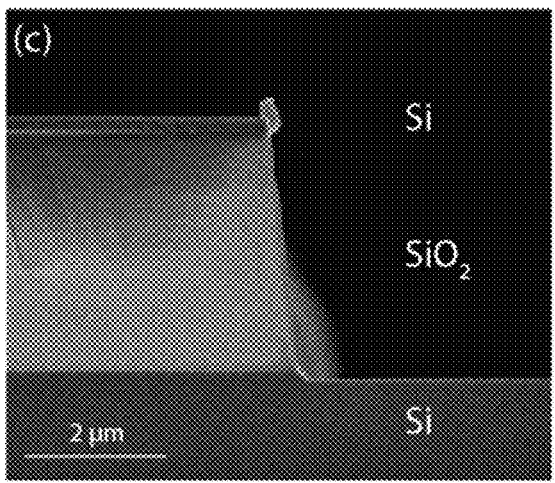
Figure 9D:
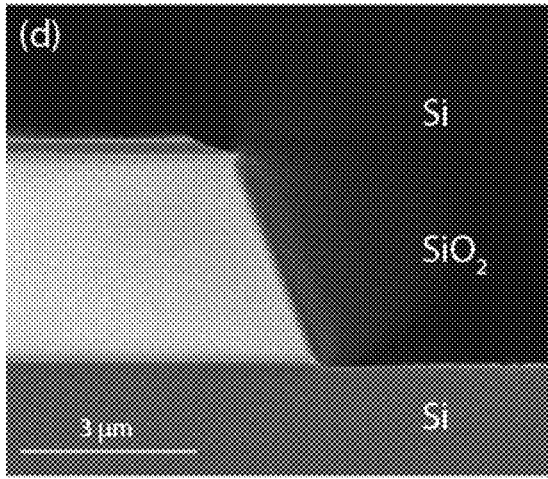
Figure 9E:
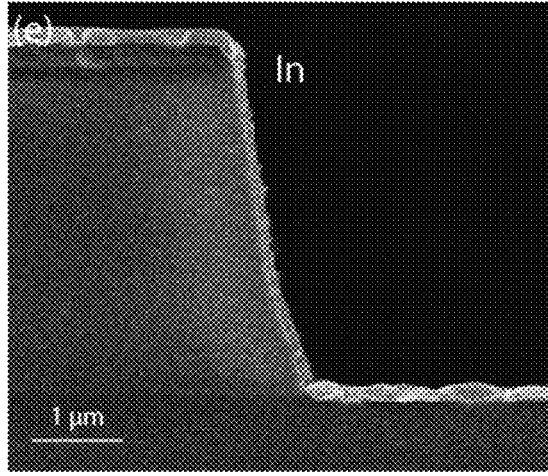
Figure 9F:
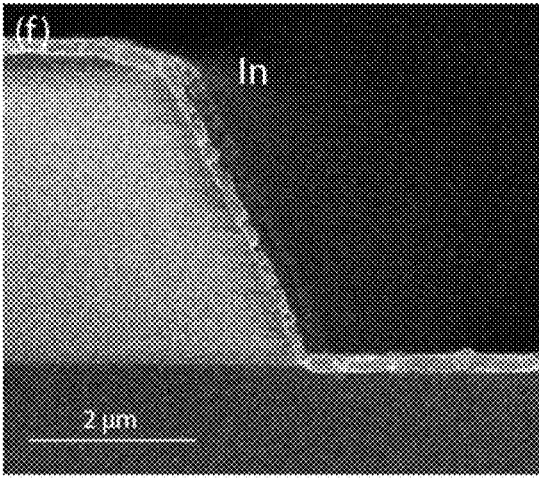

FIGS. 9A-9F are example scanning electron micrographs illustrating an effect of resist reflow on sidewall profile of a shallow recess of the silicon device layer and buried oxide layer after etching and indium deposition. FIG. 9A illustrates a sidewall profile after development for a non-reflowed case. FIG. 9B illustrates a sidewall profile after development for a reflowed case. FIG. 9C illustrates a resulting sidewall profile after reactive ion etching of the silicon device layer and buried oxide layer for the non-reflowed case. FIG. 9D illustrates a resulting sidewall profile after reactive ion etching of the silicon device layer and buried oxide layer for the reflowed case. FIG. 9E illustrates a layer of indium deposited on the sidewall of FIG. 9C which is about 63% as thick as the layer deposited on the bottom horizontal surface (e.g. base or end surface) of the recess. FIG. 9F illustrates a layer of indium deposited on the sidewall of FIG. 9D which is about 90% as thick as the layer deposited on the bottom horizontal surface (e.g. base or end surface) of the recess.

Coupling of Laser Diode

Laser diode 11 may, for example, be coupled (e.g. physically and/or electrically coupled) to chip 10 by soldering laser diode 11 to one or more metallized surfaces of recess 12. In currently preferred embodiments, laser diode 11 is soldered to at least a metallized bottom surface (e.g. base or end surface) of recess 12 (e.g. surface 12A). Laser diode 11 may be soldered to recess 12 by picking and placing laser diode 11 into recess 12.

As recess 12 may be lithographically defined, recess 12 may be precisely aligned to a photonic interface of chip 10 (e.g. photonic interface 15). In some embodiments laser diode 11 is placed in recess 12 such that the edges of the laser diode are pressed against one or more edges of recess 12 to align laser diode 11 to photonic interface 15.

The pick and place of laser diode 11 may be done manually, using a vacuum pickup tool with an appropriately sized tip, using a semi-automatic/automatic diode bonder/pick and place tool and/or the like.

To solder laser diode 11 to one or more surfaces of metallized recess 12 reflow soldering may, for example, be performed. For example, either the pick and place tool or the substrate may be heated to reach a melting point of the solderable material, indium (or another metal or metal alloy used to metallize a surface of recess 12), etc. Pressure may be applied to laser diode 11 using a diode bonder tool, needle probes in cases where solder paste is manually placed within recess 12 during the reflow solder process and/or the like.

Photonic Wire Bonding

As described elsewhere herein a photonic wire bond (e.g. photonic wire bond 14) may couple an optical output of laser diode 11 to an optical input of photonic interface 15.

Photonic wire bonds may be fabricated in polymers by exposing photoresist material using precision laser writing and two-photon absorption. Photonic wire bonds may, for example, have a coupling efficiency of about 0.7 dB between two surface couplers on a silicon chip. Numerous other interfaces and ways of coupling between components exist, including optical fibers, lasers, optical amplifiers and silicon photonic chips. In conventional photonic systems, each optical coupling procedure requires discrete components (e.g. lenses, isolators, etc.) and six degree of freedom nanopositioning, alignment and welding. Through computer vision and automation, however, the photonic wire bond method, commercialized by Vanguard™ Automation, eliminates these requirements by using simple alignment markers to locate bonding sites and to write (or form) the photonic wire bond to within less than about 30 nm accuracy. Advantageously, components to be coupled with a photonic wire bond do not need to be aligned as the photonic wire bonds are written freely between the coupling sites. The photonic wire bond tool available from Vanguard™ Automation may, for example, include automated feature recognition, automated waveguide calculation, automated positioning and automated writing. In some embodiments a total of about 10 to 30 seconds is required per photonic wire bond.

In currently preferred embodiments photonic wire bond 14 is cladded to protect it (e.g. from various environmental factors, etc.).

In one example case, a working distance of an objective lens in a photonic wire bonding system is about 250 µm. A feature or component taller than about 250 µm may cause the objective lens to physically contact (e.g. impact) the sample and damage photonic wire bond 14.

In some embodiments photonic wire bond 14 is fabricated prior to any electrical wire bonds being fabricated to avoid any conflict (e.g. physical contact) between the objective lens of the photonic wire bond system and the electrical wire bond(s) which may be greater than the working distance of the objective lens of the photonic wire bonding system (e.g. about 250 µm tall). In some cases ultrasonication associated with the electrical wire bonding process may damage or dislodge photonic wire bond 14. Once photonic wire bond 14 and any electrical wire bonds are fabricated, a cladding which may cover both photonic wire bond 14 and any electrical wire bonds (e.g. since photonic wire bond 14 and the electrical wire bonds may be in close proximity) may be deposited.

In some embodiments photonic wire bond 14 is fabricated and cladded prior to any electrical wire bonds being fabricated to protect photonic wire bond 14 from the environment and/or the electrical wire bonding process. In some such embodiments a precision dispense system is used to clad photonic wire bond to avoid covering an electrical bond pad of laser diode 11. As described elsewhere herein, one or more additional recesses (e.g. recesses 55) may confine a position of the photonic wire bond cladding relative to the chip.

In some embodiments one or more electrical wire bonds are formed prior to photonic wire bond 14 being formed.

Once the electrical wire bonds are formed, photonic wire bond 14 may be formed. A cladding may then cover both the electrical wire bonds and photonic wire bond 14. Advantageously, when electrical wire bonds are formed prior to photonic wire bond 14, ultrasonication associated with the electrical wire bonding process will not interfere with or damage photonic wire bond 14. In some embodiments a semi-automatic electric wire bonder which allows a trajectory to be programmatically defined may be used to generate the electrical wire bonds.

FIGS. 10A-10D schematically illustrate an example process for fabricating an example photonic wire bond 14 and an example electrical wire bond 19.

Figures 10A, 10B, 10C, 10D:
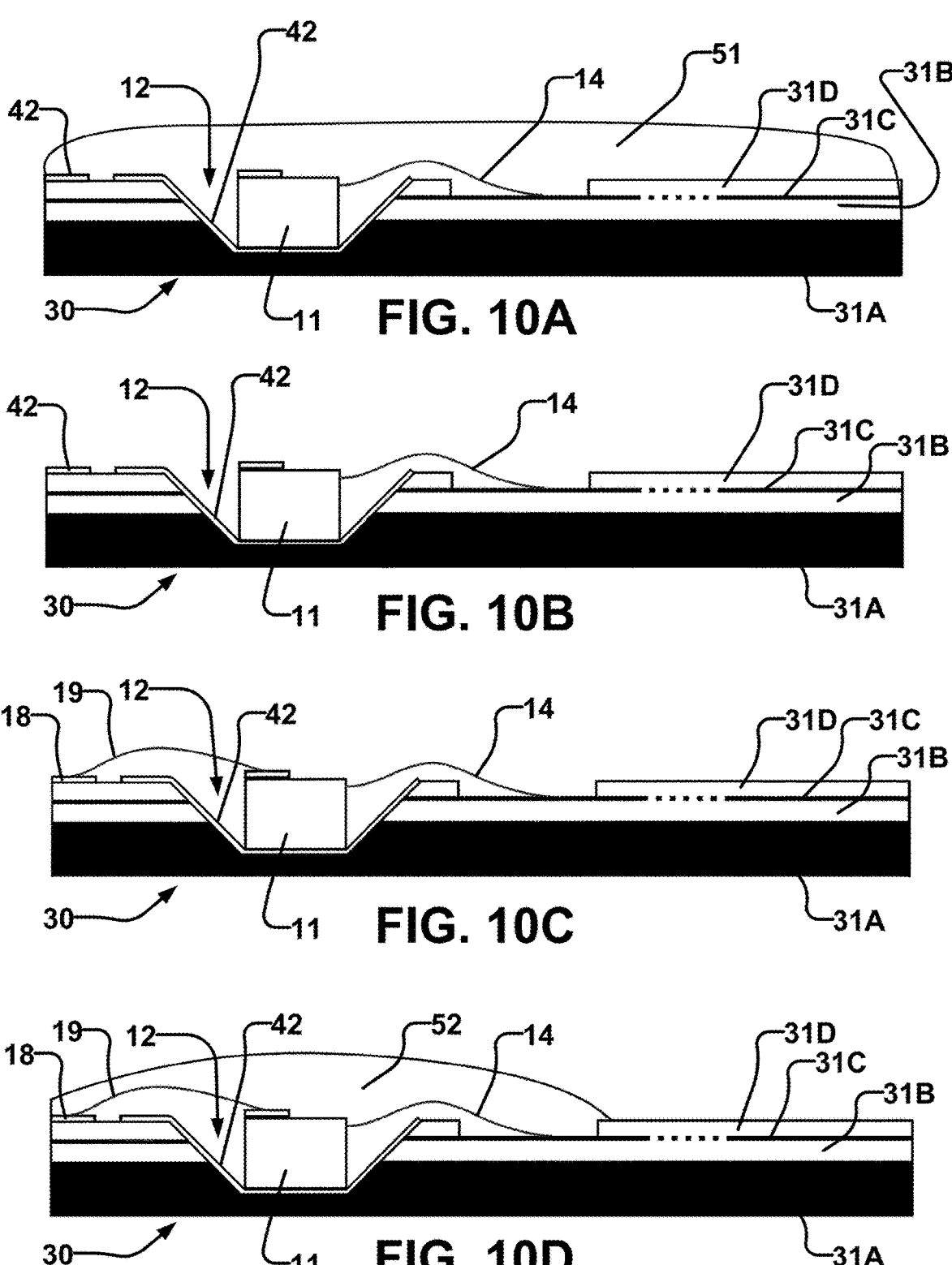
FIGS. 10A-10D schematically illustrate an example process for fabricating an example photonic wire bond and an example electrical wire bond.

In FIG. 10A a photonic wire bond resist 51 is drop cast and photonic wire bond 14 is written.

In FIG. 10B photonic wire bond 14 is developed.

In FIG. 10C electrical wire bond 19 is formed between laser diode 11 and electrical connection point 18.

In FIG. 10D a photonic wire bond cladding 52 is drop cast and cured. As shown in FIG. 10D, cladding 52 may enclose both photonic wire bond 14 and electrical wire bond 19.

In some cases a precise location of where to couple photonic wire bond 14 to an optical output of laser diode 11 (or other optical component) may be determined experimentally within a laboratory setting. Once the location is determined (e.g. based on optical coupling efficiency), the location may be used repeatedly for that type of laser diode (or other optical component).

Figure 11A:
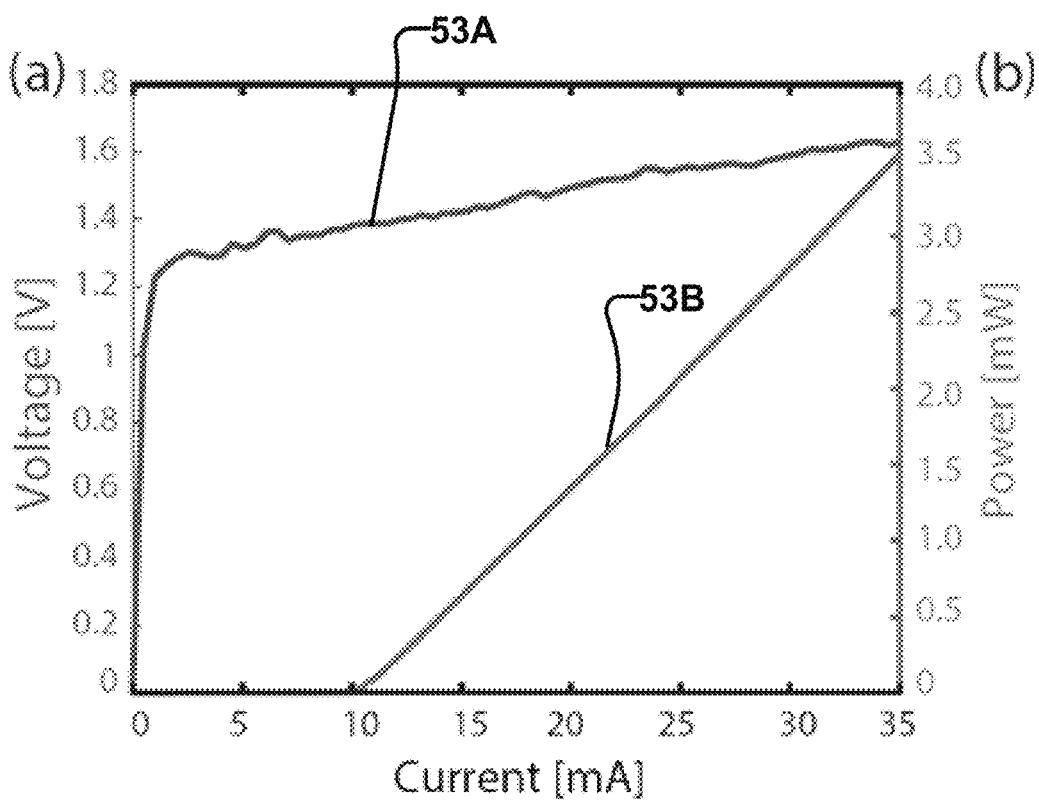
FIG. 11A is a graphical representation of an LIV curve for an example chip comprising a laser diode coupled to example silicon photonics with a photonic wire bond.
Figure 11B:
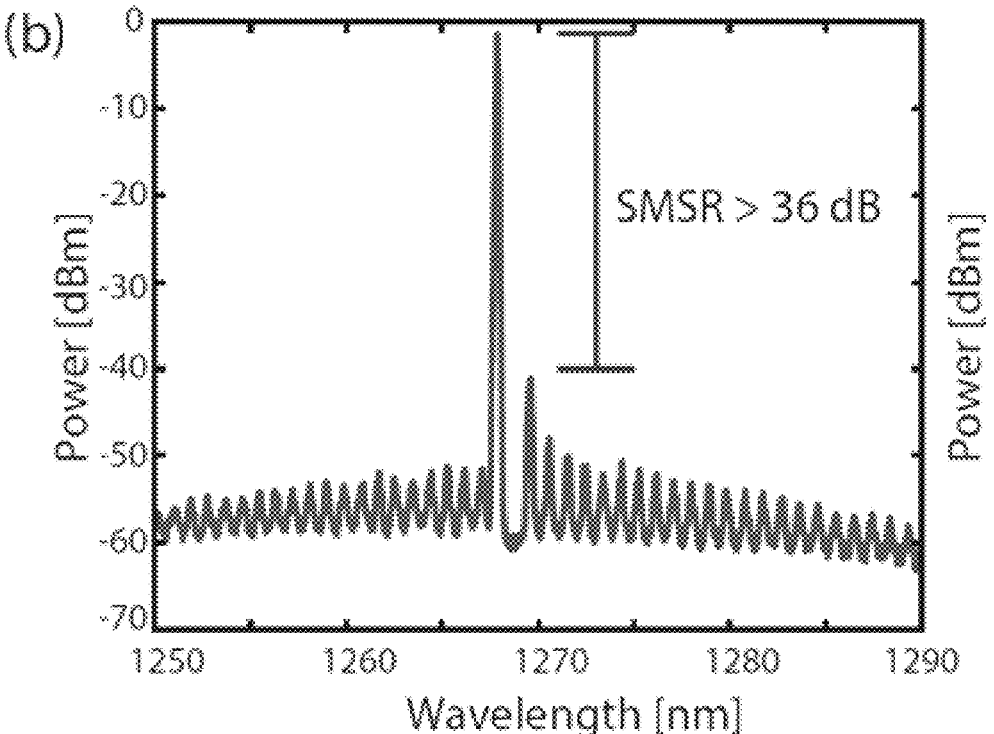
FIG. 11B is a graphical representation of a collected laser spectrum of the example chip of FIG. 11A.
Figure 11C:
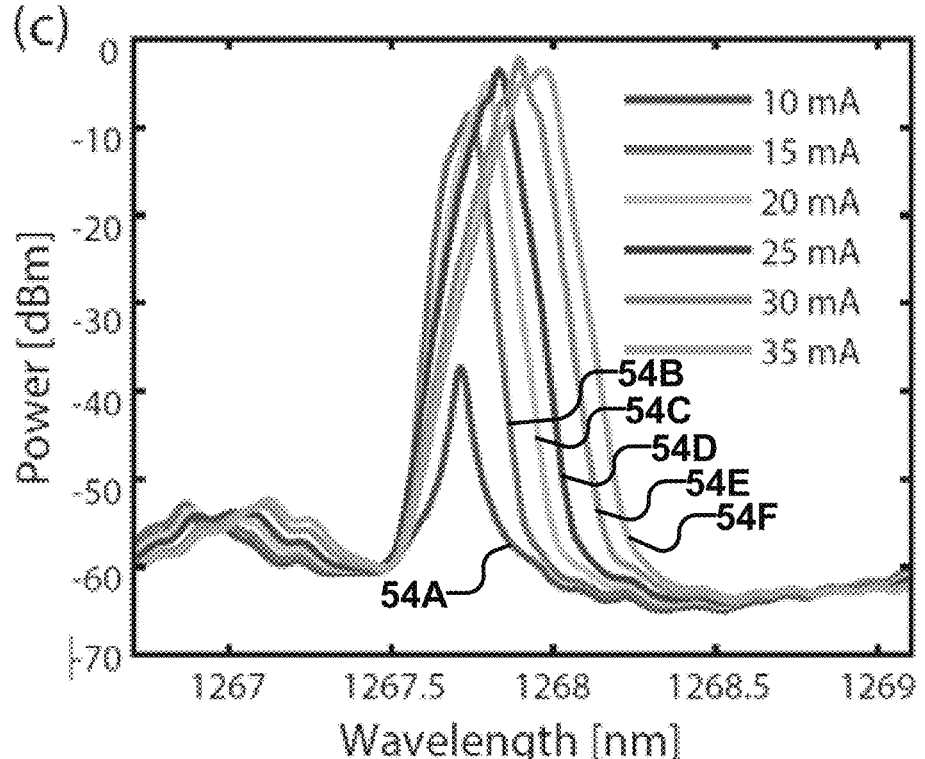
FIG. 11C is a graphical representation of an example tuning spectra of the example chip of FIG. 11A.

FIG. 11A is a graphical representation of an LIV curve for an example chip comprising a laser diode coupled to photonic interface 15 with photonic wire bond 14. In FIG. 11A curve 53A corresponds to voltage and curve 53B corresponds to power. FIG. 11B is a graphical representation of a collected laser spectrum of the example chip of FIG. 11A. FIG. 11C is a graphical representation of an example tuning spectra of the example chip of FIG. 11A. In FIG. 11C curve 54A corresponds to 10 mA, curve 54B corresponds to 15 mA, curve 54C corresponds to 20 mA, curve 54D corresponds to 25 mA, curve 54E corresponds to 30 mA and curve 54F corresponds to 35 mA.

One or More Additional Recesses

Figure 12:
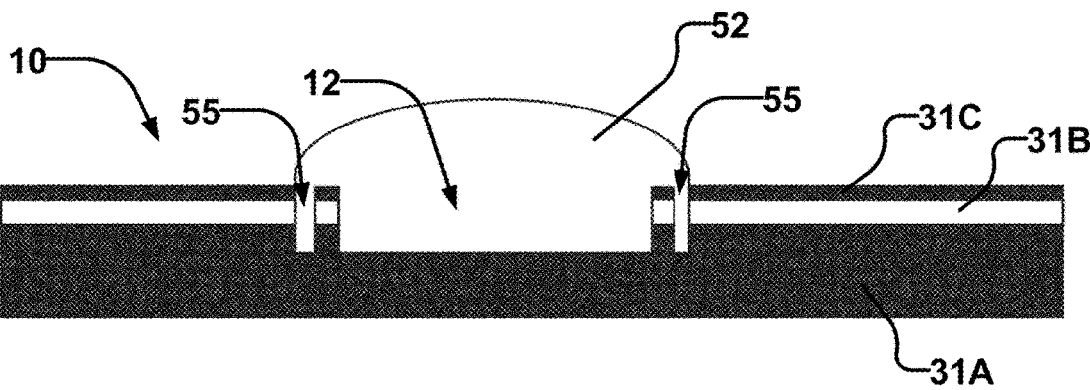
FIG. 12 is a schematic cross-sectional illustration of a semiconductor chip according to an example embodiment of the invention.

In some embodiments, as shown in example FIG. 12, chip 10 may comprise one or more additional recesses 55. Recess(es) 55 may at least partially surround a component integration area comprising one or more of recess 12, laser diode 11 (or other optical component), photonic interface 15, photonic wire bond 14 and/or the like. In some embodiments recess(es) 55 fully surround the component integration area.

Recess(es) 55 may advantageously be configured to confine photonic wire bond cladding 52 to the component integration area. In some embodiments photonic wire bond cladding 52 fully fills recess(es) 55.

In some embodiments recess(es) 55 confine photonic wire bond cladding 52 to the component integration area by exploiting surface tension effects between photonic wire bond cladding 52 and one or more surfaces of chip 10 (e.g. a surface of layer 31C or 31D).

Recess(es) 55 may be fabricated concurrently with recess 12 or separately from recess 12. Recess(es) 55 may be fabricated using the same or a different process as recess 12. Recess(es) 55 may have the same or a different depth than recess 12.

EXAMPLE APPLICATION

Figure 13:
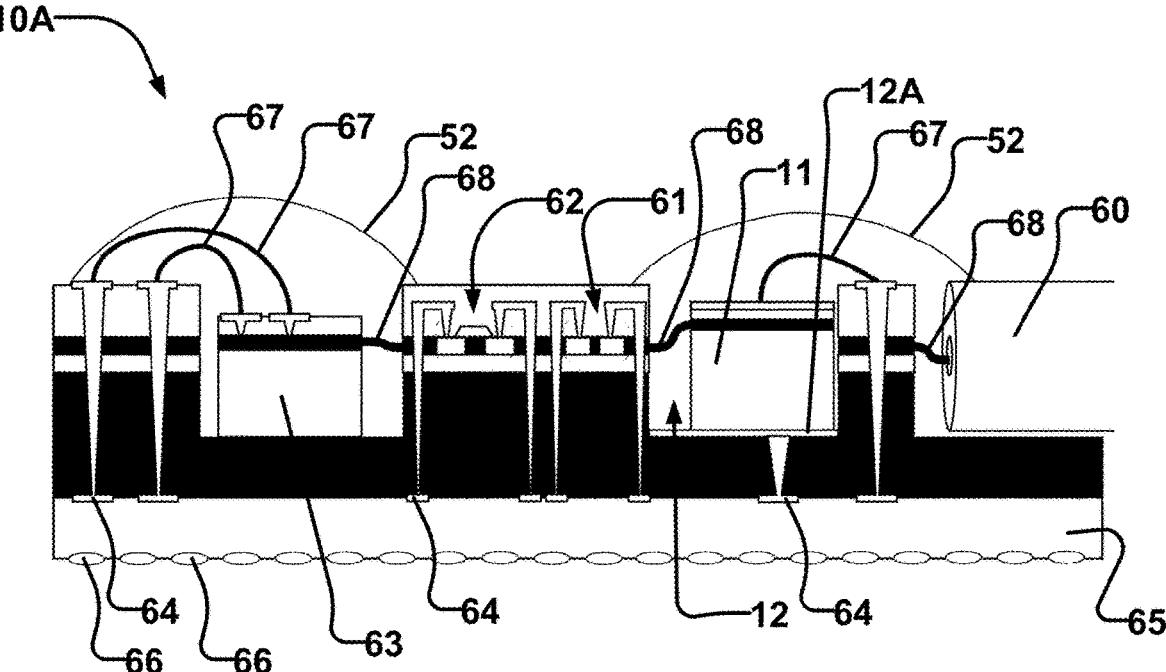
FIG. 13 is a schematic cross-sectional illustration of an example semiconductor chip.

FIG. 13 illustrates an example chip 10A fabricated using the methods described herein. Chip 10A comprises a laser diode 11 (e.g. a distributed feedback (DFB) laser diode) and an optical fiber 60. Example chip 10A also comprises a thermo-optic phase shifter 61, a silicon-germanium (SI-GE) photodiode 62 and a thin-film lithium niobate (TFLN) modulator chip 63. Through-silicon vias 64 provide electrical connections between integrated circuit (IC) submount 65 and components of chip 10A. IC submount 65 comprises a plurality of electrical connection pins 66. The example circuit of chip 10A comprises electric wire bonds 67 and photonic wire bonds 68.

Chip 10A is an example of a chip that integrates a plurality of optical components (e.g. laser diode 11, optical fiber 60, etc.) with silicon photonics. Chip 10A additionally comprises one or more components which are electrically active (e.g. thermo-optic phase shifter 61, photodiode 62, etc.). The electrically active components may perform one or more of the following functions (non-limiting):
  optical phase shifting;
  optical phase modulation;
  optical intensity modulation;
  optical switching of light in the circuit;
  detection of light (e.g. by converting light to an electrical
    signal with, for example, an integrated photodiode);
  etc.

By coupling IC submount 65 to chip 10A, control of chip 10A (or individual components of chip 10A such as laser diode 11) may also be integrated. For example, select ones of electrical connection pins 66 may be configured to control one or more components of chip 10A.

As shown in FIG. 13, laser diode 11 may be optically coupled to silicon photonics of chip 10A with a photonic wire bond 68.

TFLN modulator chip 63 is an example of a component which typically is not a silicon photonic component but may be integrated into chip 10A using the methods described herein. Components such as TFLN modulator chip 63 may have advantageous material properties which are typically not present in conventional silicon photonics components.

Optical fiber 60 may be optically coupled to chip 10A with a photonic wire bond 68. In some embodiments optical fiber 60 collects output light from chip 10A for downstream external processing. In some embodiments optical fiber 60 inputs light into chip 10A from an external source. In some embodiments optical fiber 60 may both collect output light from chip 10A for downstream external processing and input light into chip 10A from an external source. A depth of a recess configured to receive optical fiber 60 may be configured as described elsewhere herein to appropriately match output/input heights of chip 10A and optical fiber 60 (e.g. to avoid small radius of curvature photonic wire bonds).

Alternative Embodiments

As described elsewhere herein the systems and methods described herein are not limited to integration of laser diodes into SOI chips. In some embodiments laser diode 11 is replaced with one or more other optical components such as alternative light sources, semiconductor optical amplifiers, superluminescent light emitting diodes, lithium niobate modulators, optical fibers, etc.

In some embodiments an etch depth of recess 12 is varied such that recess 12 is replaced with a bore that extends completely through the silicon handle layer (e.g. layer 31A). Replacing recess 12 with a bore may facilitate integration of an optical component which has a thickness that is greater than the thickness of the SOI wafer (or other wafer or substrate). In some such cases a submount for the chip and optical component may at least partially set a height differential between an optical output of the optical component and an input and/or output of the photonic interface. In some cases one or more surfaces of the submount may be metallized such that the metallized surfaces of the submount may provide an electrical coupling to the optical component.

Although the systems and methods described herein have been described in relation to an SOI wafer, the systems and methods described herein are not limited to SOI wafers. In some embodiments an SOI wafer is replaced with GaAs, InP, $SiO_2$, diamond and/or the like.

In some embodiments one or more photonic wire bonds (e.g. photonic wire bond 14) are replaced with or substituted with one or more polymer lenses. By replacing a photonic wire bond with a polymer lens, a component that does not have a photonic interface (e.g. a grating coupler, waveguide, etc.) may, for example, be integrated onto the chip (e.g. chip 10). Components which do not have a photonic interface may, for example, comprise one or more of (non-limiting):

a bulk optic such as a piece of magneto-optic material comprising yttrium iron garnet crystals;
    a faraday rotator;
    an optical isolator;
    gas cells;
    samples (solid, liquid or gas);
    etc.

Since such components may be optically coupled with a free space coupling (i.e. there is no physical attachment of polymer to the component to form an optical coupling), the one or more polymer lenses may advantageously be fabricated (e.g. done all at once at the wafer scale) prior to the component or sample being placed into the recess (e.g. recess 12).

In some embodiments at least one polymer lens is fabricated after a component has been placed in the recess. In some such embodiments a depth of the recess may be varied to reduce or eliminate the likelihood of an apparatus (e.g. an objective lens) used to fabricate the polymer lens physically impacting the chip (e.g. physically coming into contact with the component, etc.).

In some embodiments a lid (e.g. lid 73) is coupled to the chip to seal a sample placed within the recess. In some embodiments the seam between the lid and the chip is hermetically sealed. For example, the seam between the lid and the chip may be sealed by performing a laser sealing process, a resistance sealing process, etc.

In one example case, the one or more polymer lenses may be designed to effectively manipulate light output from silicon photonics or a photonic interface (e.g. photonic interface 15), to optically couple the light to the optical component and to effectively focus collected light on the other side of the optical component back into the silicon photonics or photonic interface.

In some embodiments the chip comprises a plurality of polymer lenses. In some embodiments one side of a recess may not comprise a polymer lens. In some such embodiments the side of the recess without a polymer lens may be left open to free space, to an optical fiber, etc.

Figure 14A:
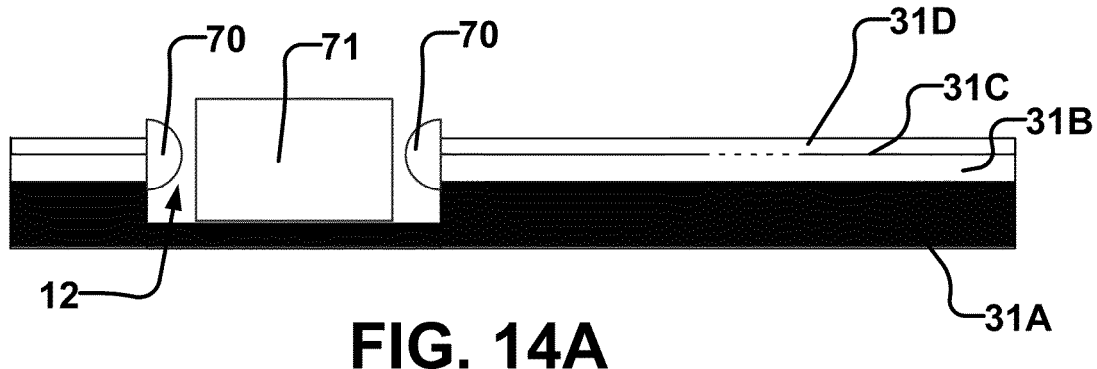
FIG. 14A is a schematic cross-sectional illustration of a semiconductor chip according to an example embodiment of the invention.

FIG. 14A schematically illustrates an example chip which comprises a plurality of polymer lenses 70 and a component 71.

Figure 14B:
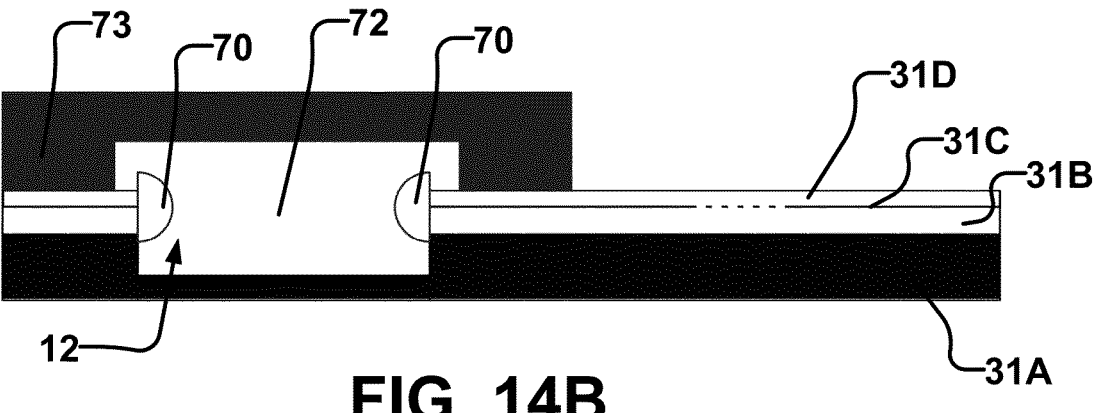
FIG. 14B is a schematic cross-sectional illustration of a semiconductor chip according to an example embodiment of the invention.

FIG. 14B schematically illustrates an example chip which comprises a plurality of polymer lenses 70, a sample 72 and a lid 73 sealing the sample within recess 12.

Interpretation of Terms

Unless the context clearly requires otherwise, throughout the description and the claims:

"comprise", "comprising", and the like are to be construed in an inclusive sense, as opposed to an exclusive or exhaustive sense; that is to say, in the sense of "including, but not limited to";

"connected", "coupled", or any variant thereof, means any connection or coupling, either direct or indirect, between two or more elements; the coupling or connection between the elements can be physical, logical, or a combination thereof;

"herein", "above", "below", and words of similar import, when used to describe this specification, shall refer to this specification as a whole, and not to any particular portions of this specification;

"or", in reference to a list of two or more items, covers all of the following interpretations of the word: any of the items in the list, all of the items in the list, and any combination of the items in the list;

the singular forms "a", "an", and "the" also include the meaning of any appropriate plural forms.

Words that indicate directions such as "vertical", "transverse", "horizontal", "upward", "downward", "forward", "backward", "inward", "outward", "left", "right", "front", "back", "top", "bottom", "below", "above", "under", and the like, used in this description and any accompanying claims (where present), depend on the specific orientation of the apparatus described and illustrated. The subject matter described herein may assume various alternative orientations. Accordingly, these directional terms are not strictly defined and should not be interpreted narrowly.

For example, while processes or blocks are presented in a given order, alternative examples may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times.

In addition, while elements are at times shown as being performed sequentially, they may instead be performed simultaneously or in different sequences. It is therefore intended that the following claims are interpreted to include all such variations as are within their intended scope.

Where a component (e.g. a software module, processor, assembly, device, circuit, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

Specific examples of systems, methods and apparatus have been described herein for purposes of illustration. These are only examples. The technology provided herein can be applied to systems other than the example systems described above. Many alterations, modifications, additions, omissions, and permutations are possible within the practice of this invention. This invention includes variations on described embodiments that would be apparent to the skilled addressee, including variations obtained by: replacing features, elements and/or acts with equivalent features, elements and/or acts; mixing and matching of features, elements and/or acts from different embodiments; combining features, elements and/or acts from embodiments as described herein with features, elements and/or acts of other technology; and/or omitting combining features, elements and/or acts from described embodiments.

Various features are described herein as being present in "some embodiments". Such features are not mandatory and may not be present in all embodiments. Embodiments of the invention may include zero, any one or any combination of two or more of such features. This is limited only to the extent that certain ones of such features are incompatible with other ones of such features in the sense that it would be impossible for a person of ordinary skill in the art to construct a practical embodiment that combines such incompatible features. Consequently, the description that "some embodiments" possess feature A and "some embodiments" possess feature B should be interpreted as an express indication that the inventors also contemplate embodiments which combine features A and B (unless the description states otherwise or features A and B are fundamentally incompatible).

It is therefore intended that the following appended claims and claims hereafter introduced are interpreted to include all such modifications, permutations, additions, omissions, and sub-combinations as may reasonably be inferred. The scope of the claims should not be limited by the preferred embodiments set forth in the examples, but should be given the broadest interpretation consistent with the description as a whole.

What is claimed is:

1. A method for fabricating a semiconductor chip with an integrated laser diode, the method comprising:
   providing a semiconductor chip comprising optical and electrical components;
   fabricating a recess in the semiconductor chip by removing material from a portion of a thickness of the semiconductor chip, the recess shaped to receive the laser diode;
   metallizing at least one surface of the recess by depositing metal into the recess;
   placing the laser diode into the recess and, when the laser diode is in the recess, electrically coupling the laser diode to the at least one metallized surface of the recess, the laser diode comprising a p-type semiconductor and an n-type semiconductor, the n-type semiconductor electrically coupled to the at least one metallized surface of the recess; and
   optically coupling an optical output of the laser diode to an optical input of a photonic interface of the chip with a photonic wire bond.

2. The method of claim 1 wherein one or both of the at least one metallized surface of the recess and the p-type semiconductor of the laser diode are electrically coupled to corresponding electrical connection surfaces of the chip with electrical wire bonds.

3. The method of claim 2 comprising forming the electrical wire bonds prior to forming the photonic wire bond.

4. The method of claim 3 comprising enclosing the photonic wire bond and the electrical wire bonds in a protective cladding.

5. The method of claim 2 comprising enclosing the photonic wire bond in a protective cladding prior to forming the electrical wire bonds.

6. The method of claim 1 wherein the recess comprises angled side walls and metallizing at least one surface of the recess comprises metallizing the angled sidewalls.

7. The method of claim 6 comprising electrically coupling the metallized angled side walls of the recess to a corresponding electrical connection surface of the chip.

8. The method of claim 1 wherein coupling the laser diode to the at least one metallized surface of the recess comprises soldering the n-type semiconductor of the laser diode to the at least one metallized surface of the recess.

9. The method of claim 8 wherein soldering the n-type semiconductor of the laser diode comprises performing reflow soldering.

10. The method of claim 1 wherein fabricating the recess comprises at least partially etching a silicon handle layer of the semiconductor chip.

11. The method of claim 10 wherein at least partially etching a silicon handle layer of the semiconductor chip comprises performing a dry or wet etch.

12. The method of claim 11 wherein performing a dry etch comprises performing a Bosch etch.

13. The method of claim 11 wherein performing a wet etch comprises etching the silicon handle layer with potassium hydroxide (KOH) or tetramethylammonium hydroxide (TMAH).

14. The method of claim 1 wherein fabricating the recess comprises fabricating the recess to have a depth in the semiconductor chip which depends on the height of a facet of laser diode.

15. The method of claim 14 wherein a difference between the height of the facet and the depth of the recess is less than about 30 μm.

16. The method of claim 1 wherein the coupling efficiency of the photonic wire bond is about 0.7 dB.

17. The method of claim 1 comprising fabricating one or more additional recesses, the one or more additional recesses configured to confine a position of photonic wire bond cladding relative to the chip.

18. The method of claim 17 wherein the one or more additional recesses are fabricated concurrently with the recess configured to receive the laser diode.

19. The method of claim 17 comprising etching the one or more additional recesses.

20. A method for fabricating a semiconductor chip with an integrated optical component, the method comprising:
   providing a semiconductor chip comprising optical and electrical components;
   fabricating a recess or bore in the semiconductor chip by removing material from a portion of a thickness of the semiconductor chip, the recess or bore shaped to receive the optical component;
   metallizing at least one surface of the recess or bore by depositing metal into the recess;
   placing the laser diode into the recess and, when the laser diode is in the recess, electrically coupling the optical component to the at least one metallized surface of the recess or bore; and
   optically coupling the optical component to a photonic interface of the chip with one or both of a photonic wire bond and at least one polymer lens.

* * * * *